US012785631B2

(12) United States Patent
Hong et al.

(10) Patent No.: US 12,785,631 B2
(45) Date of Patent: Nov. 3, 2026

(54) POWER AMPLIFIER

(71) Applicant: Samsung Electro-Mechanics Co., Ltd., Suwon-si (KR)

(72) Inventors: Kyung Hee Hong, Suwon-si (KR); Jaehyouck Choi, Suwon-si (KR); Kyujin Choi, Suwon-si (KR); Yoshiyuki Tonami, Suwon-si (KR); Ingeun Yu, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 427 days.

(21) Appl. No.: 18/420,875

(22) Filed: Jan. 24, 2024

(65) Prior Publication Data

US 2024/0380367 A1 Nov. 14, 2024

(30) Foreign Application Priority Data

May 12, 2023 (KR) ........................ 10-2023-0061588
Sep. 18, 2023 (KR) ........................ 10-2023-0124048

(51) Int. Cl.
*H03F 1/52* (2006.01)
*H03F 1/02* (2006.01)
*H03F 3/24* (2006.01)

(52) U.S. Cl.
CPC ............. *H03F 1/52* (2013.01); *H03F 1/0233* (2013.01); *H03F 3/245* (2013.01); *H03F 2200/105* (2013.01); *H03F 2200/426* (2013.01); *H03F 2200/451* (2013.01)

(58) Field of Classification Search
CPC .......... H03F 1/52; H03F 1/0233; H03F 3/245; H03F 2200/105; H03F 2200/426; H03F 2200/451
USPC .......................................................... 330/291
See application file for complete search history.

(56) References Cited

U.S. PATENT DOCUMENTS 7,148,748 B2 12/2006 Apel
9,577,591 B2 2/2017 Ortiz
9,667,200 B2 * 5/2017 Ripley ..................... H04B 1/04
2005/0225394 A1 * 10/2005 Doherty .................... H03F 1/30 330/285
2011/0298545 A1 * 12/2011 Morimoto .............. H03F 3/195 330/296

(Continued)

FOREIGN PATENT DOCUMENTS

JP 4609300 B2 1/2011

*Primary Examiner* — Hafizur Rahman
(74) *Attorney, Agent, or Firm* — NSIP Law

(57) ABSTRACT

A power amplifier includes a first power transistor configured to amplify a first input radio-frequency (RF) signal and output a first output RF signal; a first transistor comprising a control terminal, a first terminal receiving a first voltage, and a second terminal supplying a first bias current to the first power transistor; a second power transistor configured to amplify a second input RF signal and output a second output RF signal; a second transistor comprising a control terminal, a first terminal receiving a second voltage, and a second terminal supplying a second bias current to the second power transistor; a signal detection circuit configured to detect a first value corresponding to a magnitude of either the first output RF signal or the second output RF signal; and a power supply voltage control circuit configured to adjust the first voltage and/or the second voltage in response to the first value.

34 Claims, 17 Drawing Sheets

(56) References Cited

U.S. PATENT DOCUMENTS

| | | | | |
|---|---|---|---|---|
| 2019/0356288 | A1* | 11/2019 | Tsutsui | H03F 1/0261 |
| 2020/0186093 | A1* | 6/2020 | Seong | H03F 1/22 |
| 2021/0126600 | A1* | 4/2021 | Sukemori | H03F 1/0266 |
| 2024/0007057 | A1* | 1/2024 | Peng | H03F 1/52 |
| 2025/0096730 | A1* | 3/2025 | Liu | H03F 1/0227 |

* cited by examiner

1000A

1000C

1000D

1000E

1000F

POWER AMPLIFIER

CROSS-REFERENCE TO RELATED APPLICATIONS

This application claims the benefit under 35 USC 119 (a) of Korean Patent Application Nos. 10-2023-0061588 filed on May 12, 2023, and 10-2023-0124048 filed on Sep. 18, 2023, in the Korean Intellectual Property Office, the entire disclosures of which are incorporated herein by reference for all purposes.

BACKGROUND

1. Field

The following description relates to a power amplifier.

2. Description of Related Art

Wireless communication systems apply various digital modulation and demodulation schemes according to the evolution of communication standards. The existing code-division multiple access (CDMA) communication system adopts the quadrature phase-shift keying (QPSK) method, and the existing wireless LAN following the IEEE communication standard adopts the orthogonal frequency-division multiplexing (OFDM) method. In addition, the long-term evolution (LTE) and LTE Advanced (LTE+ or LTE-A) standards, which are recent 3GPP standards, adopt QPSK, quadrature amplitude modulation (QAM), and OFDM schemes.

Transmitting devices used in wireless communication systems include a power amplifier that amplifies radio-frequency (RF) signals to increase a transmission distance.

If the voltage in the power amplifier exceeds a predetermined threshold level, a problem may occur in the power amplifier. To prevent this problem, the power amplifier may include a protection circuit. For example, in an AMR (absolute maximum rating) condition—that is, Pin (input power)=15 dBm, load VSWR (voltage standing wave ratio) 10:1, and all-phase condition—it may be necessary to protect the power amplifier. In other words, excessive current may flow under conditions where an excessive input RF signal is applied and the load changes significantly. At this time, a breakdown voltage or higher is applied to an element included in the power amplifier (for example, a power transistor), which may cause damage to the element.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, power amplifier includes a first power transistor configured to amplify a first input radio-frequency (RF) signal and output a first output RF signal; a first transistor including a control terminal, a first terminal configured to receive a first voltage, and a second terminal configured to supply a first bias current to the first power transistor; a second power transistor configured to amplify a second input RF signal and output a second output RF signal; a second transistor including a control terminal, a first terminal configured to receive a second voltage, and a second terminal configured to supply a second bias current to the second power transistor; a signal detection circuit configured to detect a first value corresponding to a magnitude of either the first output RF signal or the second output RF signal; and a power supply voltage control circuit configured to adjust a third voltage in response to the first value, the third voltage being either one or both of the first voltage and the second voltage.

The power supply voltage control circuit may be further configured to decrease the third voltage in response to the first value being greater than a predetermined value, and either one or both of the first transistor and the second transistor may be configured to decrease either one or both of the first bias current and the second bias current in response to the third voltage decreasing.

The power supply voltage control circuit may include a first resistor connected to a first power supply voltage; a second resistor having one end connected to the first resistor at a first node; and a third transistor including a control terminal configured to receive the first value, a first terminal connected to another end of the second resistor, and a second terminal connected to a ground, and the third voltage may be a voltage at the first node where the first resistor and the second resistor are connected to each other.

The third transistor may be configured to turn on and decrease the third voltage in response to the first value being greater than a predetermined value.

The signal detection circuit may be further configured to detect an envelope of the first output RF signal or the second output RF signal and output the detected envelope as the first value.

The signal detection circuit may include an electrostatic discharge protection circuit including a plurality of diodes connected in series between an RF signal output terminal and the ground, the RF signal output terminal being a terminal of the first power transistor configured to output the first output RF signal or a terminal of the second power transistor configured to output the second output RF signal; and an envelope detection circuit configured to receive a first signal from a second node where two diodes of the plurality of diodes are connected to each other, detect an envelope of the first signal, and output the detected envelope of the first signal as the first value.

The envelope detection circuit may include a first diode having an anode connected to the second node; a capacitor connected between a cathode of the first diode and the ground; a third resistor having one end connected to the cathode of the first diode; and a fourth resistor connected between another end of the third resistor and the ground, and the control terminal of the third transistor may be connected to the other end of the third resistor.

The signal detection circuit may be further configured to detect a value corresponding to the magnitude of the first output RF signal as the first value, and the power supply voltage control circuit may be further configured to adjust the second voltage in response to the first value.

The power supply voltage control circuit may be further configured to decrease the second voltage in response to the first value being greater than a predetermined value, and the second transistor may be configured to decrease the second bias current in response to the second voltage decreasing.

The power supply voltage control circuit may include a first resistor connected to a first power supply voltage; a second resistor having one end connected to the first resistor at a node; and a third transistor including a control terminal configured to receive the first value, a first terminal connected to another end of the second resistor, and a second terminal connected to a ground, and the first terminal of the second transistor may be connected to the node where the first resistor and the second resistor are connected to each other.

The signal detection circuit may be further configured to detect a value corresponding to the magnitude of the second output RF signal as the first value, and the power supply voltage control circuit may be further configured to adjust the first voltage and the second voltage in response to the first value.

The power supply voltage control circuit may be further configured to decrease the first voltage and the second voltage in response to the first value being greater than a predetermined value, the first transistor may be configured to decrease the first bias current in response to the first voltage decreasing, and the second transistor may be configured to decrease the second bias current in response to the second voltage decreasing.

The power supply voltage control circuit may include a first resistor connected to a first power supply voltage; a second resistor having one end connected to the first resistor at a node; and a third transistor including a control terminal configured to receive the first value, a first terminal connected to another end of the second resistor, and a second terminal connected to a ground, and the first terminal of the first transistor and the first terminal of the second transistor may be connected to the node where the first resistor and the second resistor are connected to each other.

The signal detection circuit may be further configured to detect a value corresponding to the magnitude of the second output RF signal as the first value, and the power supply voltage control circuit may be further configured to adjust the second voltage in response to the first value.

The signal detection circuit may be further configured to decrease the second voltage in response to the first value being greater than a predetermined value, and the second transistor may be configured to decrease the second bias current in response to the second voltage decreasing.

The power supply voltage control circuit may include a first resistor connected to a first power supply voltage; a second resistor having one end connected to the first resistor at a node; and a third transistor including a control terminal configured to receive the first value, a first terminal connected to another end of the second resistor, and a second terminal connected to a ground, and the first terminal of the second transistor may be connected to the node where the first resistor and the second resistor are connected to each other.

The signal detection circuit may be further configured to detect a value corresponding to the magnitude of the second output RF signal as the first value, and the power supply voltage control circuit may be further configured to adjust the first voltage in response to the first value.

The power supply voltage control circuit may be further configured to decrease the first voltage in response to the first value being greater than a predetermined value, and the first transistor may be configured to decrease the first bias current in response to the first voltage decreasing.

The power supply voltage control circuit may include a first resistor connected to a first power supply voltage; a second resistor having one end connected to the first resistor at a node; and a third transistor including a control terminal configured to receive the first value, a first terminal connected to another end of the second resistor, and a second terminal connected to a ground, and the first terminal of the first transistor may be connected to the node where the first resistor and the second resistor are connected to each other.

The signal detection circuit may be further configured to detect a value corresponding to the magnitude of the first output RF signal as the first value, and the power supply voltage control circuit may be further configured to adjust the first voltage and the second voltage in response to the first value.

The power supply voltage control circuit may be further configured to decrease the first voltage and the second voltage in response to the first value being greater than a predetermined value, the first transistor may be configured to decrease the first bias current in response to the first voltage decreasing, and the second transistor may be configured to decrease the second bias current in response to the second voltage decreasing.

The power supply voltage control circuit may include a first resistor connected to a first power supply voltage; a second resistor having one end connected to the first resistor at a node; and a third transistor including a control terminal configured to receive the first value, a first terminal connected to another end of the second resistor, and a second terminal connected to a ground, and the first terminal of the first transistor and the first terminal of the second transistor may be connected to the node where the first resistor and the second resistor are connected to each other.

The signal detection circuit may be further configured to detect a value corresponding to the magnitude of the first output RF signal as the first value, and the power supply voltage control circuit may be further configured to adjust the first voltage in response to the first value.

The power supply voltage control circuit may be further configured to decrease the first voltage in response to the first value being greater than a predetermined value, and the first transistor may be configured to decrease the first bias current in response to the first voltage decreasing.

The power supply voltage control circuit may include a first resistor connected to a first power supply voltage; a second resistor having one end connected to the first resistor at a node; and a third transistor including a control terminal configured to receive the first value, a first terminal connected to another end of the second resistor, and a second terminal connected to a ground, and the first terminal of the first transistor may be connected to the node where the first resistor and the second resistor are connected to each other.

The second input RF signal may be the first output RF signal.

In another general aspect, a power amplifier includes a power transistor configured to amplify an input radio-frequency (RF) signal and output an output RF signal; a first transistor including a control terminal, a first terminal configured to receive a first voltage, and a second terminal configured to supply a bias current to the power transistor; a signal detection circuit configured to detect a first value corresponding to a magnitude of the output RF signal; and a power supply voltage control circuit configured to adjust the first voltage in response to the first value.

The power supply voltage control circuit may be further configured to decrease the first voltage in response to the first value being greater than a predetermined value, and the first transistor may be configured to decrease the bias current in response to the first voltage decreasing.

The power supply voltage control circuit may include a first resistor connected to a first power supply voltage; a second resistor having one end connected to the first resistor at a first node; and a second transistor including a control terminal configured to receive the first value, a first terminal connected to another end of the second resistor, and a second terminal connected to a ground, and the first voltage may be a voltage at the first node where the first resistor and the second resistor are connected to each other.

The first terminal of the first transistor may be connected to the first node.

The second transistor may be configured to turn on and decrease the first voltage in response to the first value being greater than a predetermined value.

The signal detection circuit may be further configured to detect an envelope of the output RF signal as the first value.

The signal detection circuit may include an electrostatic discharge protection circuit including a plurality of diodes connected in series between an RF signal output terminal and the ground, the RF signal output terminal being a terminal of the power transistor configured to output the output RF signal; and an envelope detection circuit configured to receive a first signal from a second node where two diodes of the plurality of diodes are connected to each other, detect an envelope of the first signal, and output the detected envelope of the first signal as the first value.

The envelope detection circuit may include a first diode having an anode connected to the second node; a capacitor connected between a cathode of the first diode and the ground; a third resistor having one end connected to the cathode of the first diode; and a fourth resistor connected between another end of the third resistor and the ground, and the control terminal of the second transistor may be connected to the other end of the third resistor.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
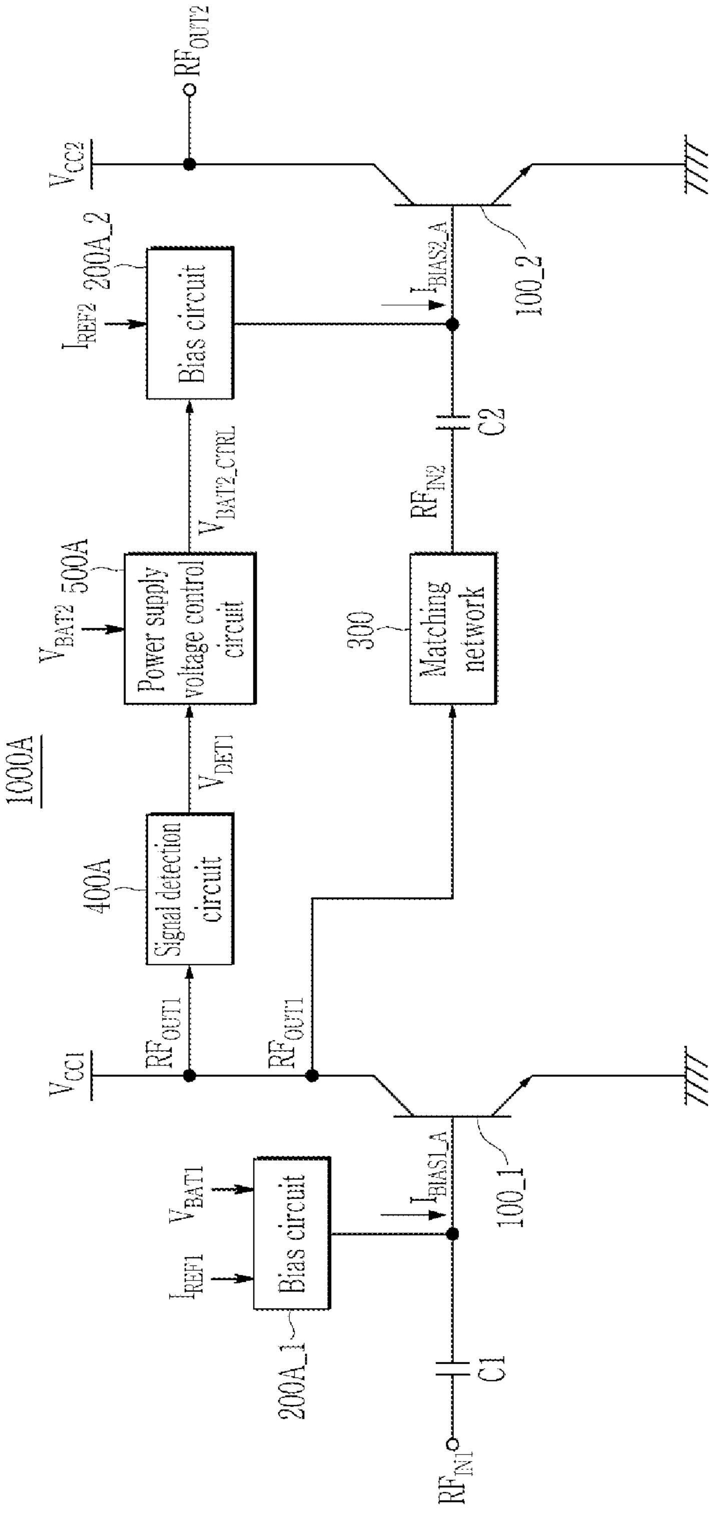
FIG. 1 illustrates a power amplifier 1000A according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The use of the term “may” with respect to an example or embodiment, e.g., as to what an example or embodiment may include or implement, means that at least one example or embodiment exists in which such a feature is included or implemented, while all examples and embodiments are not necessarily limited thereto.

Throughout the specification, when an element, such as a layer, region, or substrate, is described as being “on,” “connected to,” or “coupled to” another element, it may be directly “on,” “connected to,” or “coupled to” the other element, or there may be one or more other elements intervening therebetween. In contrast, when an element is described as being “directly on,” “directly connected to,” or “directly coupled to” another element, there can be no other elements intervening therebetween.

As used herein, the term “and/or” includes any one and any combination of any two or more of the associated listed items.

Although terms such as “first,” “second,” and “third” may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In this application, an RF signal includes Wi-Fi (IEEE 802.11 family, etc.), WiMAX (IEEE 802.16 family, etc.), IEEE 802.20, LTE (Long-Term Evolution), EV-DO, HSDPA, HSUPA, HSPA, HSPA+, EDGE, GSM, GPS, GPRS, CDMA, TDMA, DECT, Bluetooth, 3G, 4G, 5G, and any other wireless and wired protocols designated hereafter, but is not limited thereto.

FIG. 1 illustrates a power amplifier 1000A according to an example.

As shown in FIG. 1, the power amplifier 1000A may include a power transistor 100_1, a bias circuit 200A_1, a capacitor C1, a power transistor 100_2, a bias circuit 200A_2, a capacitor C2, and a matching network 300.

The power transistor 100_1, the bias circuit 200A_1, and the capacitor C1 may constitute a first stage amplifier, and the power transistor 100_2, the bias circuit 200A_2, and the capacitor C2 may constitute a second stage amplifier. The first stage amplifier may be a driver amplifier, and the second stage amplifier may be a power amplifier.

The power transistor 100_1 may include an input terminal and an output terminal. The input terminal may be the base of the power transistor 100_1, and the output terminal may be the collector of the power transistor 100_1. The power transistor 100_1 may amplify a power of an input RF signal $RF_{IN1}$ input to the input terminal (for example, the base) and output the amplified power to the output terminal (for example, the collector). In FIG. 1, the RF signal output from the output terminal of the power transistor 100_1 is indicated as "output RF signal $RF_{OUT1}$". An emitter of the power transistor 100_1 may be connected to a ground, and although not shown in FIG. 1, a resistor may be connected between the emitter of the power transistor 100_1 and the ground. In addition, the collector of the power transistor 100_1 may be connected to a power supply voltage $V_{CC1}$, and the power transistor 100_1 may be operated by the power supply voltage $V_{CC1}$. Although not shown in FIG. 1, an inductor that performs an RF choke function may be connected between the collector of the power transistor 100_1 and the power supply voltage $V_{CC1}$.

The power transistor 100_1 may be implemented by various types of transistors such as a heterojunction bipolar transistor (HBT), a bipolar junction transistor (BJT), and an insulated gate bipolar transistor (IGBT). Although the power transistor 100_1 is shown as an n-type transistor in FIG. 1, it may be replaced with a p-type transistor.

The capacitor C1 is a coupling capacitor, and may be connected to the input terminal (for example, the base) of the power transistor 100_1. That is, the input RF signal $RF_{IN1}$ may be input to one end of the capacitor C1, and the other end of the capacitor C1 may be connected to the base of the power transistor 100_1. The capacitor C1 may perform a function of blocking a direct current (DC) component in the input RF signal $RF_{IN1}$.

The bias circuit 200A_1 may receive a reference current $I_{REF1}$ and a power supply voltage $V_{BAT1}$ from an external source. The bias circuit 200A_1 may generate a bias current $I_{BIAS1\_A}$ required by the power transistor 100_1 using the reference current $I_{REF1}$ and the power supply voltage $V_{BAT1}$. The bias current $I_{BIAS1\_A}$ is supplied to the input terminal (for example, the base) of the power transistor 100_1, and a bias level (a bias point) of the power transistor 100_1 may be set by the bias current $I_{BIAS1\_A}$. The power supply voltage $V_{BAT1}$ may be a voltage supplied from a battery.

The power transistor 100_2 may include an input terminal and an output terminal. The input terminal may be the base of the power transistor 100_2, and the output terminal may be the collector of the power transistor 100_2. The power transistor 100_2 may amplify a power of an input RF signal $RF_{IN2}$ input to the input terminal (for example, the base) and output the amplified power to the output terminal (for example, the collector). In FIG. 1, the RF signal output from the output terminal of the power transistor 100_2 is indicated as "output RF signal $RF_{OUT2}$". An emitter of the power transistor 100_2 may be connected to the ground, and although not shown in FIG. 1, a resistor may be connected between the emitter of the power transistor 100_2 and the ground. In addition, the collector of the power transistor 100_2 may be connected to a power supply voltage $V_{CC2}$, and the power transistor 100_2 may be operated by the power supply voltage $V_{CC2}$. Although not shown in FIG. 1, an inductor that performs an RF choke function may be connected between the collector of the power transistor 100_2 and the power supply voltage $V_{CC2}$. The power supply voltage $V_{CC2}$ and the power supply voltage $V_{CC1}$ may be provided from the same source or different sources.

The power transistor 100_2 may be implemented by various types of transistors such as a heterojunction bipolar transistor (HBT), a bipolar junction transistor (BJT), and an insulated gate bipolar transistor (IGBT). Although the power transistor 100_2 is shown as an n-type transistor in FIG. 1, it may be replaced with a p-type transistor.

The matching network 300 may be connected between the output terminal (for example, the collector) of the power transistor 100_1 and the input terminal (for example, the base) of the power transistor 100_2. The matching network 300 performs impedance matching between the output RF signal $RF_{OUT1}$ and the input terminal of the power transistor 100_2. The matching network 300 may be implemented by any one or any combination of any two or more of a resistor, an inductor, and a capacitor.

The capacitor C2 is a coupling capacitor and may be connected between the matching network 300 and the input terminal (for example, the base) of the power transistor 100_2. The output RF signal $RF_{OUT1}$ may be input to the input terminal (the base) of the power transistor 100_2 through the matching network 300 and the capacitor C2. From an RF signal perspective, the output RF signal $RF_{OUT1}$ of the first stage amplifier may be the input RF signal $RF_{IN2}$ of the second stage amplifier. The capacitor C2 may perform a function of blocking a direct current (DC) component in the input RF signal $RF_{IN2}$.

When an excessive peak voltage is applied to an element (for example, the power transistor 100_1) included in the power amplifier 1000A (that is, in an abnormal state), the power amplifier 1000A according to an example performs a protection operation.

To perform this protection operation, the power amplifier 1000A according to an example may further include a signal detection circuit 400A and a power supply voltage control circuit 500A.

The signal detection circuit 400A may receive the output RF signal $RF_{OUT1}$ and detect the magnitude of the output RF signal $RF_{OUT1}$. The magnitude of the output RF signal $RF_{OUT1}$ may correspond to the peak voltage of the output RF signal $RF_{OUT1}$ or may correspond to the power of the output RF signal $RF_{OUT1}$. The signal detection circuit 400A may generate a detection voltage $V_{DET1}$ corresponding to the magnitude of the output RF signal $RF_{OUT1}$. In more detail, the signal detection circuit 400A may detect the envelope of the output RF signal $RF_{OUT1}$ and generate and output the detection voltage $V_{DET1}$ corresponding to the detected envelope. The specific configuration and operation of the signal detection circuit 400A will be described in detail with respect to FIG. 3.

The power supply voltage control circuit 500A may receive a power supply voltage $V_{BAT2}$ from an external source and receive the detection voltage $V_{DET1}$ from the signal detection circuit 400A. The power supply voltage $V_{BAT2}$ may be supplied from a battery and may be the same voltage as or a different voltage from the power supply voltage $V_{BAT1}$. The power supply voltage control circuit 500A uses the power supply voltage $V_{BAT2}$ and the detection voltage $V_{DET1}$ to generate a control power supply voltage $V_{BAT2\_CTRL}$, and the generated control power supply voltage $V_{BAT2\_CTRL}$ may be output to the bias circuit 200A_2. That is, the power supply voltage control circuit 500A can adjust (change) the control power supply voltage $V_{BAT2\_CTRL}$, which is a power supply voltage to be supplied to the bias circuit 200A_2, in response to the detection voltage $V_{DET1}$.

As an example, the control power supply voltage $V_{BAT2\_CTRL}$ may have two voltage levels. When the detection voltage $V_{DET1}$ has a value higher than a predetermined voltage level, the power supply voltage control circuit 500A may generate the control power supply voltage $V_{BAT2\_CTRL}$ having a first voltage level. When the detection voltage $V_{DET1}$ has a value less than the predetermined voltage level, the power supply voltage control circuit 500A may generate the control power supply voltage $V_{BAT2\_CTRL}$ having a second voltage level. The first voltage level may be a voltage level lower than the second voltage level. When the output RF signal $RF_{OUT1}$ is excessive, the detection voltage $V_{DET1}$ has a value above the predetermined voltage level, so hereinafter, the control power supply voltage $V_{BAT2\_CTRL}$ having the first voltage level is referred to as "abnormal control power supply voltage $V_{BAT2\_CTRL\_ABNORMAL}$". When the output RF signal $RF_{OUT1}$ is not excessive, the detection voltage $V_{DET1}$ has a value below the predetermined voltage level, so hereinafter, the control power supply voltage $V_{BAT2\_CTRL}$ having the second voltage level is referred to as "normal control power supply voltage $V_{BAT2\_CTRL\_NORMAL}$".

The bias circuit 200A_2 may receive the control power supply voltage $V_{BAT2\_CTRL}$ from the power supply voltage control circuit 500A and receive a reference current $I_{REF2}$ from an external source. The bias circuit 200A_2 may generate a bias current $I_{BIAS2\_A}$ required by the power transistor 100_2 using the control power supply voltage $V_{BAT2\_CTRL}$ and the reference current $I_{REF2}$. The bias current $I_{BIAS2\_A}$ is supplied to the input terminal (for example, the base) of the power transistor 100_2, and a bias level (a bias point) of the power transistor 100_2 may be set by the bias current $I_{BIAS2\_A}$.

When the control power supply voltage $V_{BAT2\_CTRL}$ is the abnormal control power supply voltage $V_{BAT2\_CTRL\_ABNORMAL}$, the bias circuit 200A_2 may generate an abnormal bias current $I_{BIAS2\_A\_ABNORMAL}$. When the control power supply voltage $V_{BAT2\_CTRL}$ is the normal control supply power voltage $V_{BAT2\_CTRL\_NORMAL}$, the bias circuit 200A_2 may generate a normal bias current $I_{BIAS2\_A\_NORMAL}$. The abnormal bias current $I_{BIAS2\_A\_ABNORMAL}$ has a lower current value than the normal bias current $I_{BIAS2\_A\_NORMAL}$. Due to the abnormal bias current $I_{BIAS2\_A\_ABNORMAL}$ having a low current value, the power transistor 100_2 performs an amplification operation with a low gain, and the power amplifier 1000A may be protected from an excessive peak voltage. As an example, the abnormal bias current $I_{BIAS2\_A\_ABNORMAL}$ may be 0 mA. When the abnormal bias current $I_{BIAS2\_A\_ABNORMAL}$ is 0 mA, the power transistor 100_2 does not perform an amplification operation, so the power amplifier 1000A may be protected from an excessive peak voltage.

Figure 2:
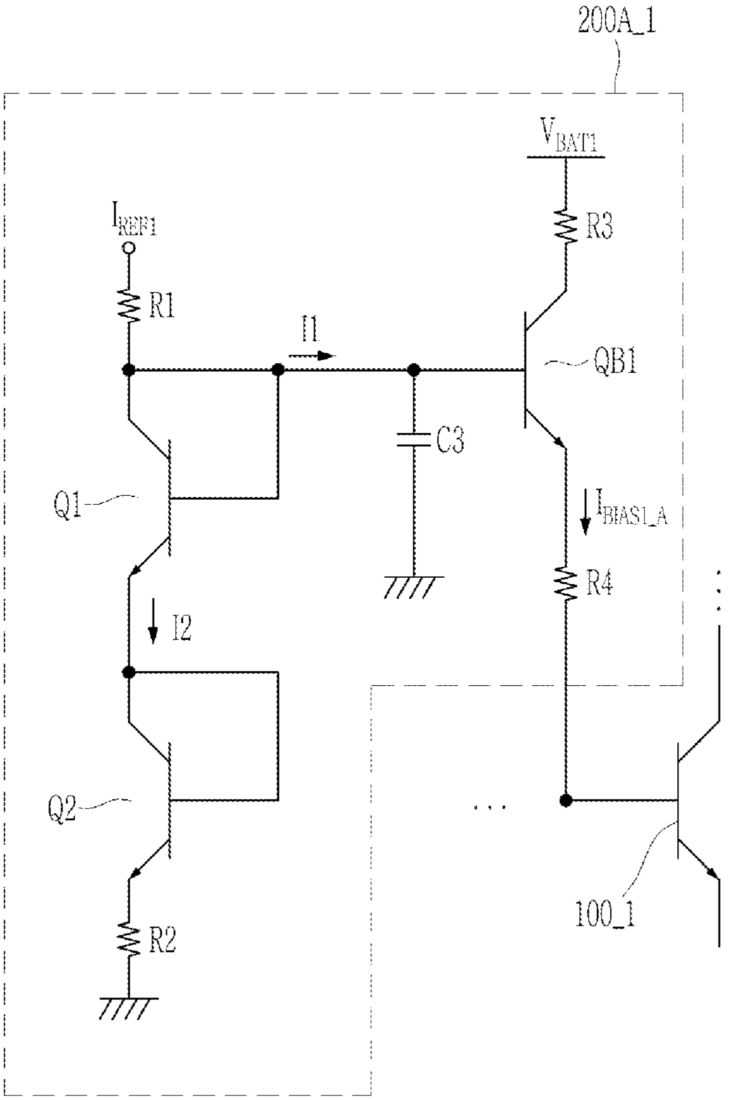
FIG. 2 is a circuit diagram showing an example of a bias circuit 200A_1 of FIG. 1.

FIG. 2 is a circuit diagram showing an example of the bias circuit 200A_1 of FIG. 1.

As shown in FIG. 2, the bias circuit 200A_1 may include a transistor Q1, a transistor Q2, a transistor QB1, a resistor R1, a resistor R2, a resistor R3, a resistor R4, and a capacitor C3.

The transistors Q1, Q2, QB1 may be implemented by various types of transistors such as a heterojunction bipolar transistor (HBT), a bipolar junction transistor (BJT), and an insulated gate bipolar transistor (IGBT). In addition, although the transistors Q1, Q2, QB1 are shown as n-type transistors in FIG. 2, they may be replaced with p-type transistors. Since the bases of the transistors Q1, Q2, QB1 serve as control terminals, the term "control terminal" may be used. Since the collectors of the transistors Q1, Q2, QB1 are one terminal of the transistor, the term "first terminal" or "second terminal" may be used. In addition, since the emitters of the transistors Q1, Q2, QB1 are also one terminal of the transistor, the term "second terminal" or "first terminal" may be used.

A base and a collector of the transistor Q1 may be connected to each other in a diode-connected structure, and the collector of the transistor Q1 may receive the reference current $I_{REF1}$ through the resistor R1. The transistor Q1 serves to sink a current I2 from the reference current $I_{REF1}$. The reference current $I_{REF1}$ may be a current source.

A base and a collector of the transistor Q2 may be connected to each other in a diode-connected structure, and the collector of the transistor Q2 may be connected to the emitter of the transistor Q1. An emitter of the transistor Q2 may be connected to a ground through the resistor R2.

A collector of the transistor QB1 may be connected to the power supply voltage $V_{BAT1}$ through the resistor R3, and a base of the transistor QB1 may be connected to the base of the transistor Q1. In addition, an emitter of the transistor QB1 may be connected to the input terminal (for example, the base) of the power transistor 100_1 through the resistor R4. A current flowing through the emitter of the transistor QB1 is the bias current $I_{BIAS1\_A}$ described with respect to FIG. 1. The collector of the transistor QB1 is a terminal that receives the power supply voltage $V_{BAT1}$, and the emitter of the transistor QB1 is a terminal that supplies the bias current $I_{BIAS1\_A}$ to the power transistor 100_1.

The capacitor C3 may be connected between the base of the transistor QB1 and the ground. The capacitor C3 may stabilize a base voltage of the transistor QB1 and reduce an impedance of the transistor QB1.

The reference current $I_{REF1}$ is divided into a current I1 and the current I2, and the current I1 may be input to the base of the transistor QB1. Accordingly, the bias current $I_{BIAS1\_A}$ may be determined corresponding to the current I1. The bias current $I_{BIAS1\_A}$ may also be determined corresponding to the base voltage of the transistor QB1.

Figure 3:
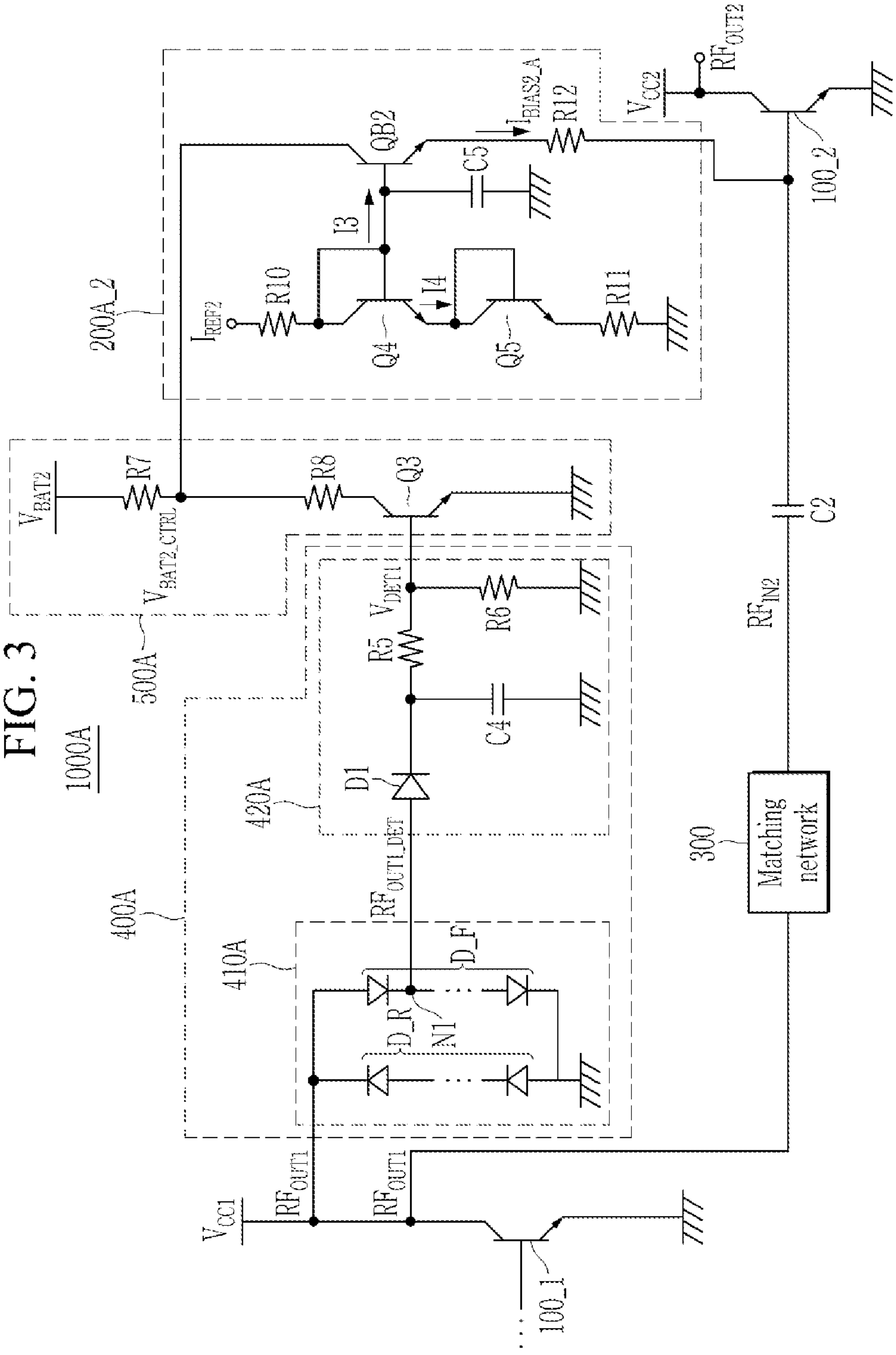
FIG. 3 is a circuit diagram showing internal configurations of a signal detection circuit 400A, a power supply voltage control circuit 500A, and a bias circuit 200A_2 of FIG. 1.

FIG. 3 is a circuit diagram showing internal configurations of the signal detection circuit 400A, the power supply voltage control circuit 500A, and the bias circuit 200A_2 of FIG. 1.

As shown in FIG. 3, the signal detection circuit 400A according to an example may include an electrostatic discharge (ESD) protection circuit 410A and an envelope detection circuit 420A.

The electrostatic discharge protection circuit 410A may be connected to the point where power is supplied from an external source and may block an excessive voltage or current. Since the power supply voltage $V_{CC1}$ is supplied from an external source to the output terminal of the power transistor 100_1, the electrostatic discharge protection circuit 410A may be connected between the output terminal (for example, the collector) of the power transistor 100_1 and a ground. As shown in FIG. 3, the electrostatic discharge protection circuit 410A according to an example may include a plurality of forward-biased diodes D_F and a plurality of reverse-biased diodes D_R. When an excessive voltage or current is input, the plurality of forward-biased diodes D_F or the plurality of reversed-biased diodes D_R are turned on. Accordingly, the power transistor 100_1 may be protected. The plurality of forward-biased diodes D_F include a plurality of diodes connected in series in a forward direction, and the plurality of reversed-biased diodes D_R include a plurality of diodes connected in series in a reverse direction. In FIG. 3, a node where at least two diodes are connected to each other among the plurality of forward-biased diodes D_F is indicated as "node N1".

The envelope detection circuit 420A may detect the envelope of the RF signal corresponding to the output RF signal $RF_{OUT1}$ and may generate the detection voltage $V_{DET1}$ corresponding to the detected envelope. As shown in FIG. 3, the envelope detection circuit 420A according to an example may include a diode D1, a capacitor C4, a resistor R5, and a resistor R6.

An anode of the diode D1 may be connected to the node N1, and the capacitor C4 may be connected between a cathode of the diode D1 and the ground. One end of the resistor R5 may be connected to the cathode of the diode D1, and the resistor R6 may be connected between the other end of the resistor R5 and the ground. The voltage at the node where the resistor R5 and the resistor R6 are connected to each other corresponds to the detection voltage $V_{DET1}$ described above.

When an electrostatic discharge (ESD) is applied to the electrostatic discharge protection circuit 410A, the plurality of forward-biased diodes D_F or the plurality of reversed-biased diodes D_R may be turned on. At this time, since the current flows to the ground, the electrostatic discharge protection circuit 410A operates and the power transistor 100_1 can be protected. A voltage (potential) of the node N1 may be equal to a voltage of the ground.

When an ESD is not applied to the electrostatic discharge protection circuit 410A, the electrostatic discharge protection circuit 410A does not operate. In other words, the plurality of forward-biased diodes D_F and the plurality of reversed-biased diodes D_R are turned off. Even when an ESD is not applied, damage to devices may occur due to an excessive RF signal input and an excessive load mismatch. To prevent this, the power amplifier 1000A according to one example performs a protection operation.

When the electrostatic discharge protection circuit 410A does not operate (that is, the plurality of forward-biased diodes D_F and the plurality of reversed-biased diodes D_R do not turn on), an RF signal corresponding to the output RF signal $RF_{OUT1}$ may appear (be generated) at the node N1. When the electrostatic discharge protection circuit 410A does not operate, a voltage swing of the output RF signal $RF_{OUT1}$ is equally distributed across the plurality of forward-biased diodes D_F, and the voltage swing level appears differently depending on the location of the node N1. That is, an RF signal corresponding to the output RF signal $RF_{OUT1}$ may appear at the node N1. Hereinafter, the RF signal appearing at the node N1 is referred to as the "detection RF signal" and it is indicated as "$RF_{OUT1\_DET}$" in FIG. 3. When the plurality of forward-biased diodes D_F and the plurality of reversed-biased diodes D_R are in the off state, a current does not flow, so the electrostatic discharge protection circuit 410A has an infinite impedance (that is, is in an open state). Due to this infinite impedance, the detection RF signal $RF_{OUT1\_DET}$ may not affect the output RF signal $RF_{OUT1}$.

The detection RF signal $RF_{OUT1\_DET}$ is input to the envelope detection circuit 420A. The diode D1 and the capacitor C4 of the envelope detection circuit 420A operate as a rectifier circuit. That is, the envelope of the detection RF signal $RF_{OUT1\_DET}$ may be detected by the diode D1 and the capacitor C4. The detected envelope is divided by the resistor R5 and the resistor R6, and the detection voltage $V_{DET1}$ corresponding to the detected envelope may be generated. That is, the envelope detection circuit 420A converts the detection RF signal $RF_{OUT1\_DET}$ into the detection voltage $V_{DET1}$. The level of the detection voltage $V_{DET1}$ may be adjusted by the values of the resistor R5 and the resistor R6.

When the magnitude of the input RF signal $RF_{IN1}$ increases, the magnitude of the output RF signal $RF_{OUT1}$ also increases. When the magnitude of the output RF signal $RF_{OUT1}$ increases, the magnitude of the detection RF signal $RF_{OUT1\_DET}$ also increases. Due to an increase in the magnitude of the detection RF signal $RF_{OUT1\_DET}$, the detection voltage $V_{DET1}$ also increases. In other words, the detection voltage $V_{DET1}$ increases in proportion to the magnitude of the input RF signal $RF_{IN1}$.

Figure 4A:
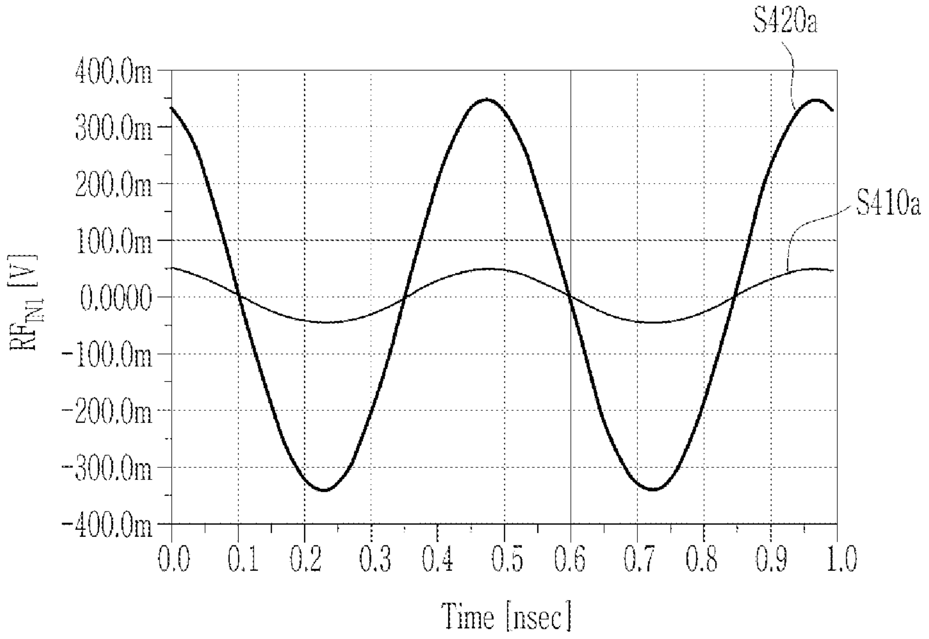
FIG. 4A is a graph showing an example of an input RF signal $RF_{IN1}$ of FIG. 1.
Figure 4B:
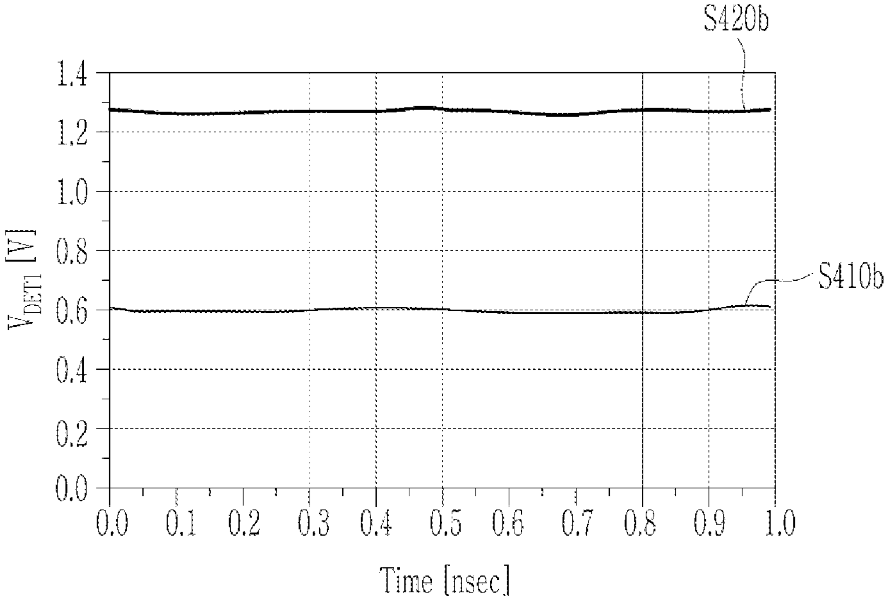
FIG. 4B is a graph showing simulation results of a detection voltage $V_{DET1}$ of FIG. 1 for the input RF signal $RF_{IN1}$ of FIG. 4A.

FIG. 4A is a graph showing an example of the input RF signal $RF_{IN1}$ of FIG. 1, and FIG. 4B is a graph showing simulation results of the detection voltage $V_{DET1}$ of FIG. 1 for the input RF signal $RF_{IN1}$ of FIG. 4A.

When the input RF signal $RF_{IN1}$ is S410*a* in FIG. 4A, the detection voltage $V_{DET1}$ is S410*b* in FIG. 4B. When the input RF signal $RF_{IN1}$ is S420*a* in FIG. 4A, the detection voltage $V_{DET1}$ is S420*b* in FIG. 4B. In other words, the detection voltage $V_{DET1}$ may increase in proportion to the magnitude (power) of the input RF signal $RF_{IN1}$.

As shown in FIG. 3, the power supply voltage control circuit 500A according to an example may include a transistor Q3, a resistor R7, and a resistor R8.

The transistor Q3 may be implemented by various types of transistors such as a heterojunction bipolar transistor (HBT), a bipolar junction transistor (BJT), and an insulated gate bipolar transistor (IGBT). In addition, although the transistor Q3 is shown as an n-type transistor in FIG. 3, it may be replaced with a p-type transistor. Since the base of the transistor Q3 serves as a control terminal, the term "control terminal" may be used. Since the collector of the Q3 is one terminal of the transistor, the term "first terminal" or "second terminal" may be used. In addition, since the emitter of the transistor Q3 is also one terminal of the transistor, the term "second terminal" or "first terminal" may be used.

The base of the transistor Q3 may be connected to the other end of the resistor R5 and may receive the detection voltage $V_{DET1}$. That is, the base of the transistor Q3 may be connected to the node where the resistor R5 and the resistor R6 are connected to each other. The emitter of the transistor Q3 may be connected to the ground. The collector of the transistor Q3 may be connected to the power supply voltage $V_{BAT2}$ through the resistor R8 and the resistor R7.

One end of the resistor R7 may be connected to the power supply voltage $V_{BAT2}$, and the resistor R8 may be connected between the other end of the resistor R7 and the collector of the transistor Q3. The voltage at the node where the resistor R7 and the resistor R8 are connected to each other is the control power supply voltage $V_{BAT2\_CTRL}$ described above. The control power supply voltage $V_{BAT2\_CTRL}$ may change depending on whether the transistor Q3 is turned on. Since the detection voltage $V_{DET1}$ is input to the base of the transistor Q3, the transistor Q3 may be turned on or off depending on the level of the detection voltage $V_{DET1}$.

When the detection voltage $V_{DET1}$ is above a predetermined level, the transistor Q3 turns on. When the detection voltage $V_{DET1}$ is above the predetermined level, the output RF signal $RF_{OUT1}$ is excessive (abnormal). That is, this is a case in which the protection operation is performed. When performing a protection operation, the magnitude of the output RF signal $RF_{OUT1}$ may be set in advance, and the level of the corresponding detection voltage $V_{DET1}$ may be adjusted according to the values of the resistor R5 and the resistor R6.

When the transistor Q3 is turned on, the control power supply voltage $V_{BAT2\_CTRL}$ may have the first voltage level. That is, the control power supply voltage $V_{BAT2\_CTRL}$ becomes the abnormal control power supply voltage $V_{BAT2\_CTRL\_ABNORMAL}$. The abnormal control power supply voltage $V_{BAT2\_CTRL\_ABNORMAL}$ may have a value expressed by Equation 1 below.

$$V_{\text{BAT2\_CTRL\_ABNORMAL}} = \frac{R8}{R7 + R8} \cdot V_{BAT2} \tag{1}$$

In Equation 1 above, it is assumed that the collector-emitter voltage of the transistor Q3 is 0 V when the transistor Q3 is turned on.

When the detection voltage $V_{DET1}$ is below the predetermined level, the transistor Q3 turns off. When the detection voltage $V_{DET1}$ is less than the predetermined level, the output RF signal $RF_{OUT1}$ is not excessive (normal). That is, this is a case in which the protection operation is not performed.

When the transistor Q3 is turned off, the control power supply voltage $V_{BAT2\_CTRL}$ may have the second voltage level. That is, the control power supply voltage $V_{BAT2\_CTRL}$ becomes the normal control power voltage $V_{BAT2\_CTRL\_NORMAL}$. The normal control power supply voltage $V_{BAT2\_CTRL\_NORMAL}$ may have a value expressed by Equation 2 below.

$$V_{\text{BAT2\_CTRL\_NORMAL}} = V_{BAT2} - I_{R7} \cdot R7 \tag{2}$$

In Equation 2 above, $I_{R7}$ represents the current flowing through the resistor R7 when the transistor Q3 is turned off.

Figure 5:
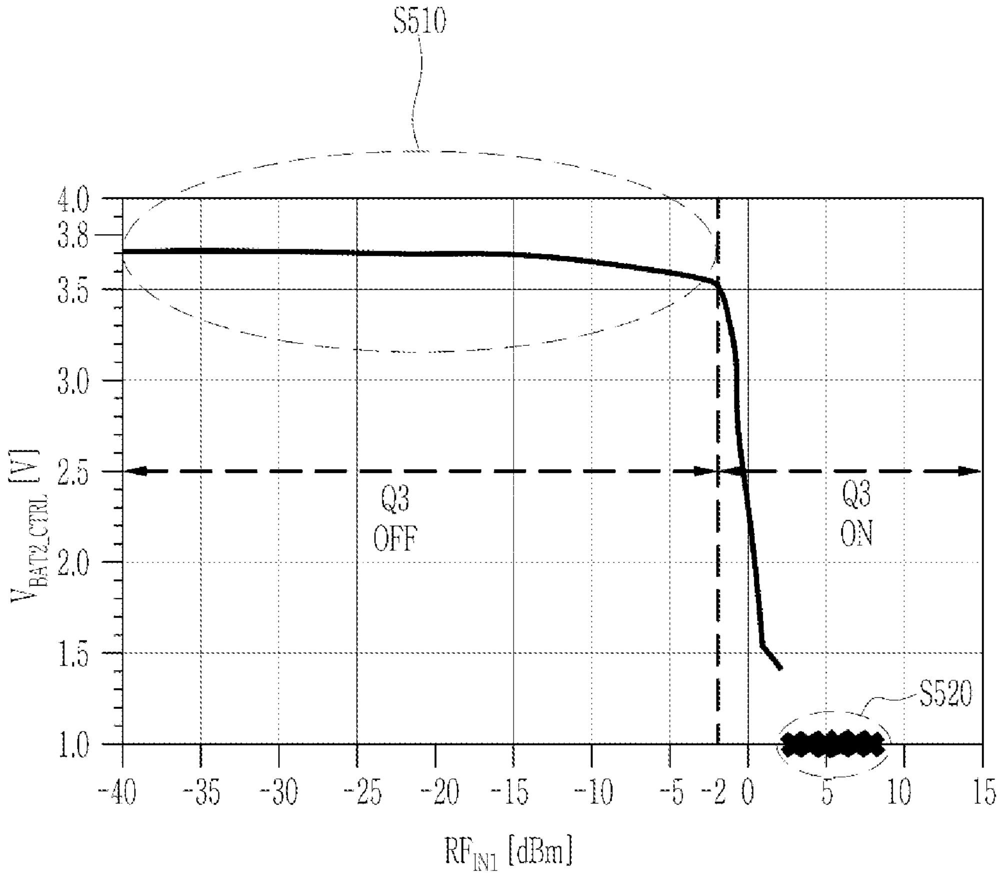
FIG. 5 is a graph showing a simulation result of a control power supply voltage $V_{BAT2\_CTRL}$ Of FIG. 1.

FIG. 5 is a graph showing a simulation result of the control power supply voltage $V_{BAT2\_CTRL}$ Of FIG. 1.

In FIG. 5, the horizontal axis represents the input RF signal $RF_{IN1}$, and the vertical axis represents the control power supply voltage $V_{BAT2\_CTRL}$. In the simulation of FIG. 5, it is assumed that the power supply voltage $V_{BAT2}$ is 3.8 V.

When the input RF signal $RF_{IN1}$ is less than −2 dBm, the transistor Q3 is turned off. This is a normal operating state in which the protection operation is not performed. Referring to S510 in FIG. 5, the control power supply voltage $V_{BAT2\_CTRL}$ has a minimum value of 3.557 V and is less than 3.8 V.

The protection operation begins when the input RF signal $RF_{IN1}$ exceeds −2 dBm, and current begins to flow to the transistor Q3. That is, when the input RF signal $RF_{IN1}$ is more than −2 dBm, the transistor Q3 is turned on, and the control power supply voltage $V_{BAT2\_CTRL}$ decreases (becomes lower). Referring to S520 in FIG. 5, the control power supply voltage $V_{BAT2\_CTRL}$ has a value of 0.35 V. Although it is not clearly shown in the graph of FIG. 5, 0.35 V is confirmed when taking a picture of the S520 part in the simulation.

According to the simulation result of FIG. 5, the normal control power supply voltage $V_{BAT2\_CTRL\_NORMAL}$ may have a value from 3.557 V to less than 3.8 V, and the abnormal control power supply voltage $V_{BAT2\_CTRL\_ABNORMAL}$ may have a value of 0.35 V. Accordingly, the abnormal control power supply voltage $V_{BAT2\_CTRL\_ABNORMAL}$ has a lower value than the normal control power supply voltage $V_{BAT2\_CTRL\_NORMAL}$. In other words, when the protection operation is performed, the transistor Q3 is turned on, which causes the control power supply voltage $V_{BAT2\_CTRL}$ to decrease (become lower).

As shown in FIG. 3, the bias circuit 200A_2 according to an example may include a transistor Q4, a transistor Q5, a transistor QB2, a resistor R10, a resistor R11, a resistor R12, and a capacitor C5.

The transistors Q4, Q5, QB2 may be implemented by various types of transistors such as a heterojunction bipolar transistor (HBT), a bipolar junction transistor (BJT), and an insulated gate bipolar transistor (IGBT). In addition, although the transistors Q4, Q5, QB2 are shown as n-type transistors in FIG. 3, they may be replaced with p-type transistors. Since the bases of the transistors Q4, Q5, QB2 serve as control terminals, the term "control terminal" may be used. Since the collectors of the transistors Q4, Q5, QB2 are one terminal of the transistor, the term "first terminal" or "second terminal" may be used. In addition, since the emitters of the transistors Q4, Q5, QB2 are also one terminal of the transistor, the term "second terminal" or "first terminal" may be used.

A base and a collector of the transistor Q4 may be connected to each other in a diode-connected structure, and the collector of the transistor Q4 may receive the reference current $I_{REF2}$ through the resistor R10. The transistor Q4 serves to sink a current I4 from the reference current $I_{REF2}$. The reference current $I_{REF2}$ may be a current source.

A base and a collector of the transistor Q5 may be connected to each other in a diode-connected structure, and the collector of the transistor Q5 may be connected to the emitter of the transistor Q4. An emitter of the transistor Q5 may be connected to the ground through the resistor R11.

A collector of the transistor QB2 may receive the control power supply voltage $V_{BAT2\_CTRL}$. That is, the collector of the transistor QB2 may be connected to the node where the resistor R7 and the resistor R8 are connected to each other. A base of the transistor QB2 may be connected to the base of the transistor Q4. An emitter of the transistor QB2 may be connected to the input terminal (for example, the base) of the power transistor 100_2 through the resistor R12. The current flowing through the emitter of the transistor QB2 is the bias current $I_{BIAS2\_A}$ described with respect to FIG. 1. The collector of the transistor QB2 is a terminal that receives the control power supply voltage $V_{BAT2\_CTRL}$, which is a power supply voltage, and the emitter of the transistor QB2 is a terminal that supplies the bias current $I_{BIAS2\_A}$ to the power transistor 100_2.

The capacitor C5 can be connected between the base of the transistor QB2 and the ground. The capacitor C5 may stabilize a base voltage of the transistor QB2 and reduce an impedance of the transistor QB2.

The reference current $I_{REF2}$ is divided into a current I3 and the current I4, and the current I3 may be input to the base of the transistor QB2. Accordingly, the bias current $I_{BIAS2\_A}$ may be determined corresponding to the current I3. Also, the bias current $I_{BIAS2\_A}$ may be determined corresponding to the base voltage of the transistor QB2.

The bias current $I_{BIAS2\_A}$ may change based on the control power supply voltage $V_{BAT2\_CTRL}$. When the control power supply voltage $V_{BAT2\_CTRL}$ decreases (becomes lower), the bias current $I_{BIAS2\_A}$ also decreases. As an example, when the control power supply voltage $V_{BAT2\_CTRL}$ is lower than a predetermined threshold voltage, the transistor QB2 does not operate (that is, the transistor QB2 is turned off), which may cause the bias current $I_{BIAS2\_A}$ to be 0 mA.

When the control power supply voltage $V_{BAT2\_CTRL}$ is the normal control power supply voltage $V_{BAT2\_CTRL\_NORMAL}$, the transistor QB2 receives a normal power voltage. Due to this, the bias current $I_{BIAS2\_A}$ also has a normal value. In other words, the bias circuit 200A_2 generates the normal bias current $I_{BIAS2\_A\_NORMAL}$. Due to the normal bias current $I_{BIAS2\_A\_NORMAL}$, the power transistor 100_2 may perform a normal amplification operation.

When the transistor Q3 is turned on due to an excessive output RF signal $RF_{OUT1}$, the control power supply voltage $V_{BAT2\_CTRL}$ becomes the abnormal control power supply voltage $V_{BAT2\_CTRL\_ABNORMAL}$. The transistor QB2 receives the abnormal control power supply voltage $V_{BAT2\_CTRL\_ABNORMAL}$, which reduces the bias current $I_{BIAS2\_A}$. In other words, the bias circuit 200A_2 generates the abnormal bias current $I_{BIAS2\_A\_ABNORMAL}$. Due to the abnormal bias current $I_{BIAS2\_A\_ABNORMAL}$, the peak voltage applied to the power transistor 100_2 does not exceed a breakdown voltage. Through this, the power amplifier 1000A may be protected from excessive RF signals.

As described above, the power amplifier 1000A according to an example performs the protection operation only when the output RF signal $RF_{OUT1}$ is excessive (that is, abnormal) and does not perform the protection operation otherwise. That is, the transistor Q3 of FIG. 3 is turned on only when the output RF signal $RF_{OUT1}$ is excessive (that is, abnormal); otherwise it remains turned off. Since the transistor Q3 does not continuously turn on and off, spurs due to oscillation may not occur.

Figure 6:
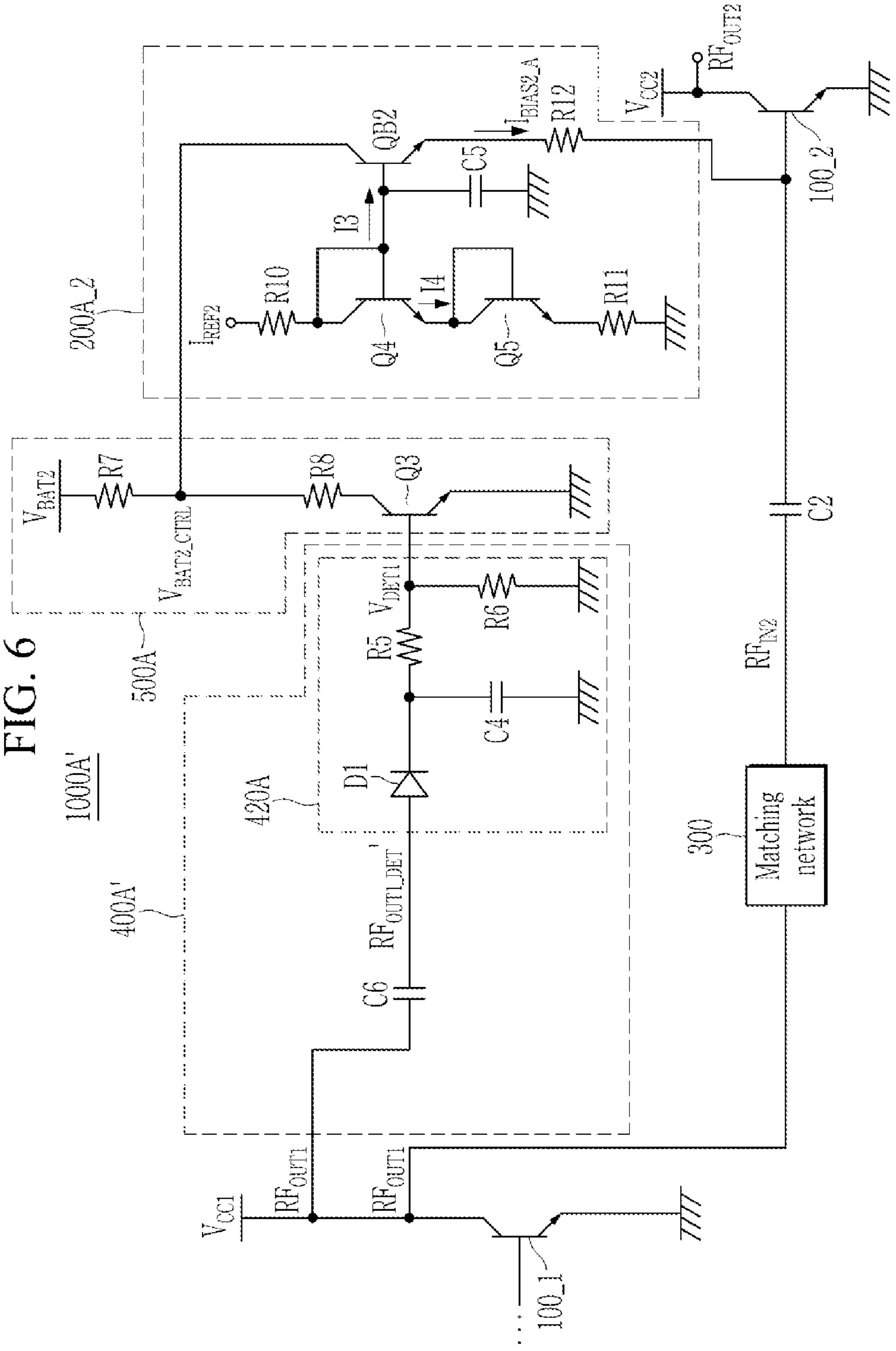
FIG. 6 illustrates a power amplifier 1000A' according to another example.

FIG. 6 illustrates a power amplifier 1000A' according to another example.

The power amplifier 1000A' of FIG. 6 is the same as the power amplifier 1000A of FIGS. 1 to 3 except that the signal detection circuit 400A in FIGS. 1 and 3 is changed to the signal detection circuit 400A' in FIG. 6. Accordingly, overlapping descriptions are omitted.

As shown in FIG. 6, in the signal detection circuit 400A' according to another example, the electrostatic discharge protection circuit 410A of FIG. 3 is replaced with a capacitor C6. One end of the capacitor C6 may be connected to the collector of the power transistor 100_1, and the other end of capacitor C6 may be connected to the anode of the diode D1. The capacitor C6 couples and outputs a portion of the output RF signal $R_{FOUT1}$ to the anode of the diode D1 as a detection RF signal $R_{FOUT1\_DET}'$.

The capacitor C6 outputs the detection RF signal $RF_{OUT1\_DET}'$ as a coupled signal to the envelope detection circuit 420A. In other words, the detection RF signal $R_{FOUT1\_DET}'$ is input to the anode of the diode D1. The envelope detection circuit 420A detects an envelope of the detection RF signal $RF_{OUT1\_DET}'$ and generates a detection voltage $V_{DET1}$ corresponding to the detected envelope.

Figure 7:
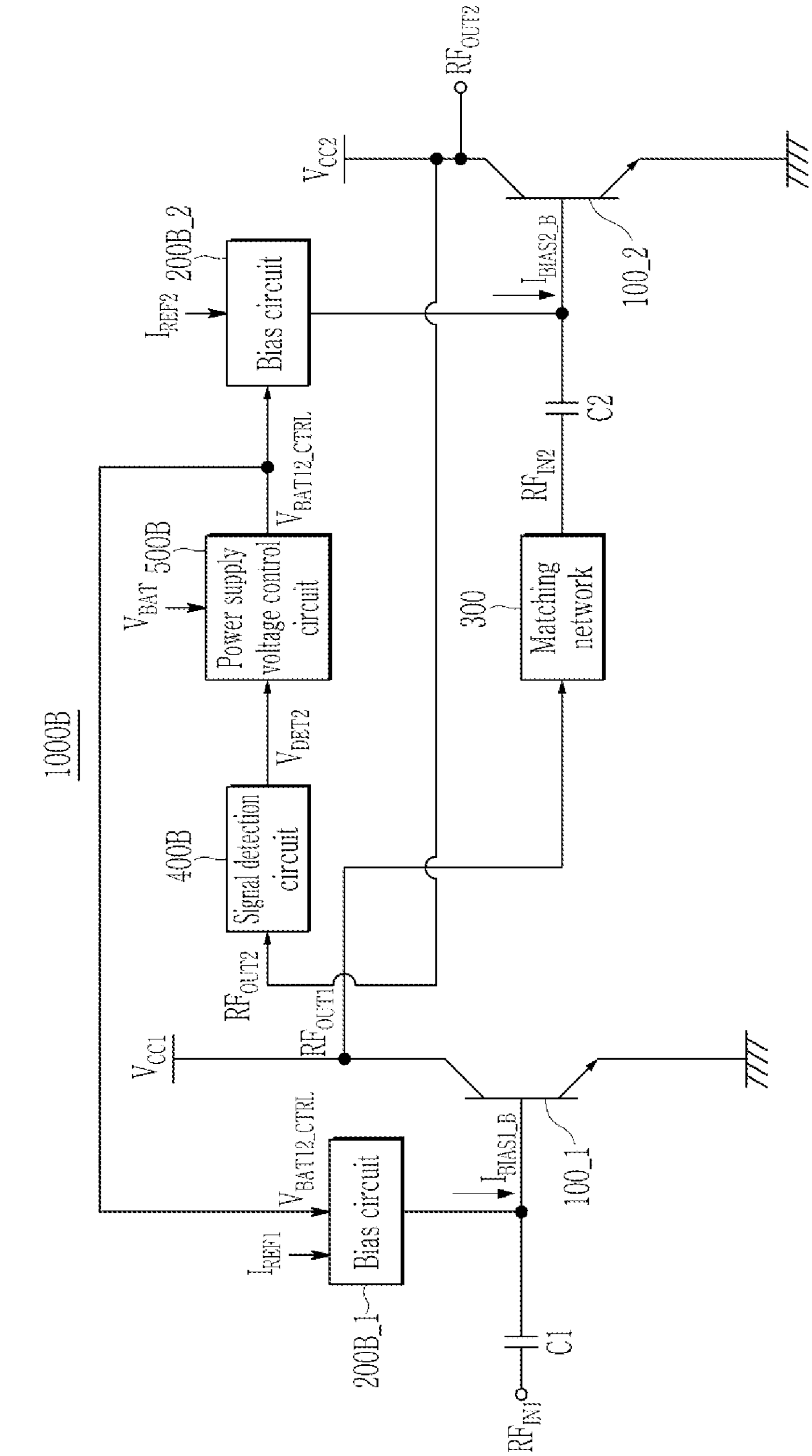
FIG. 7 illustrates a power amplifier 1000B according to another example.

FIG. 7 illustrates a power amplifier 1000B according to another example.

As shown in FIG. 7, the power amplifier 1000B according to another example may include a power transistor 100_1, a bias circuit 200B_1, a capacitor C1, a power transistor 100_2, a bias circuit 200B_2, a capacitor C2, and a matching network 300. Since the power amplifier 1000B of FIG. 7 is similar to the power amplifier 1000A of FIG. 1, overlapping descriptions may be omitted.

The bias circuit 200B_1 may receive a control power supply voltage $V_{BAT12\_CTRL}$ from a power supply voltage control circuit 500B and may receive the reference current $I_{REF1}$ from an external source. The bias circuit 200B_1 may generate a bias current $I_{BIAS1\_B}$ required by the power transistor 100_1 using the control power supply voltage $V_{BAT12\_CTRL}$ and the reference current $I_{REF1}$. The bias current $I_{BIAS1\_B}$ is supplied to the input terminal (for example, the base) of the power transistor 100_1, and the bias level (a bias point) of the power transistor 100_1 may be set by the bias current $I_{BIAS1\_B}$.

The bias circuit 200B_2 may receive the control power supply voltage $V_{BAT12\_CTRL}$ from the power supply voltage control circuit 500B and may receive a reference current $I_{REF2}$ from an external source. The bias circuit 200B_2 may generate a bias current $I_{BIAS2\_B}$ required by the power transistor 100_2 using the control power supply voltage $V_{BAT12\_CTRL}$ and the reference current $I_{REF2}$. The bias current $I_{BIAS2\_B}$ is supplied to the input terminal (for example, the base) of the power transistor 100_2, and the bias level (a bias point) of the power transistor 100_2 may be set by the bias current $I_{BIAS2\_B}$.

When an excessive peak voltage is applied to an element (for example, the power transistor 100_2) included in the power amplifier 1000B (that is, in an abnormal state), the power amplifier 1000B according to another example performs a protection operation. To perform this protection operation, the power amplifier 1000B according to another example may further include a signal detection circuit 400B and the power supply voltage control circuit 500B.

The signal detection circuit 400B may receive the output RF signal $RF_{OUT2}$ and detect the magnitude of the output RF signal $RF_{OUT2}$. The magnitude of the output RF signal $RF_{OUT2}$ may correspond to the peak voltage of the output RF signal $RF_{OUT2}$ or may correspond to the power of the output RF signal $RF_{OUT2}$. The signal detection circuit 400B may generate a detection voltage $V_{DET2}$ corresponding to the magnitude of the output RF signal $RF_{OUT2}$. In more detail, the signal detection circuit 400B may detect the envelope of the output RF signal $RF_{OUT2}$ and generate and output the detection voltage $V_{DET2}$ corresponding to the detected envelope. That is, the signal detection circuit 400B of FIG. 7 is similar to the signal detection circuit 400A of FIG. 1 except that it receives the output RF signal $RF_{OUT2}$. The specific configuration and operation of the signal detection circuit 400B will be described in detail with respect to FIG. 8.

The power supply voltage control circuit 500B may receive a power supply voltage $V_{BAT}$ from an external source and receive the detection voltage $V_{DET2}$ from the signal detection circuit 400B. The power supply voltage $V_{BAT}$ may be supplied from a battery. The power supply voltage control circuit 500B uses the power supply voltage $V_{BAT}$ and the detection voltage $V_{DET2}$ to generate a control power supply voltage $V_{BAT12\_CTRL}$, and the generated control power supply voltage $V_{BAT12\_CTRL}$ may be output to the bias circuit 200B_1 and the bias circuit 200B_2. That is, the power supply voltage control circuit 500B can adjust (change) the control power supply voltage $V_{BAT12\_CTRL}$, which is a power supply voltage to be supplied to the bias circuit 200B_1 and the bias circuit 200B_2, in response to the detection voltage $V_{DET2}$.

Similar to the control power supply voltage $V_{BAT2\_CTRL}$ of FIG. 1, the control power supply voltage $V_{BAT12\_CTRL}$ of FIG. 7 may have two voltage levels. When the detection voltage $V_{DET2}$ has a value higher than a predetermined voltage level, the power supply voltage control circuit 500B may generate the control power supply voltage $V_{BAT12\_CTRL}$ having a third voltage level. When the detection voltage $V_{DET2}$ has a value less than the predetermined voltage level, the power supply voltage control circuit 500B may generate the control power supply voltage $V_{BAT2\_CTRL}$ having a fourth voltage level. The third voltage level may be a voltage level lower than the fourth voltage level. When the output RF signal $RF_{OUT2}$ is excessive, the detection voltage $V_{DET2}$ has a value above the predetermined voltage level, so hereinafter, the control power supply voltage $V_{BAT12\_CTRL}$ having the third voltage level is referred to as "abnormal control power supply voltage $V_{BAT12\_CTRL\_ABNORMAL}$". When the output RF signal $RF_{OUT2}$ is not excessive, the detection voltage $V_{DET2}$ has a value below the predetermined voltage level, so hereinafter, the control power supply voltage $V_{BAT12\_CTRL}$ having the fourth voltage level is referred to as "normal control power supply voltage $V_{BAT12\_CTRL\_NORMAL}$".

When the control power supply voltage $V_{BAT12\_CTRL}$ is the abnormal control power supply voltage $V_{BAT12\_CTRL\_ABNORMAL}$, the bias circuit 200B_1 may generate an abnormal bias current $I_{BIAS1\_B\_ABNORMAL}$. When the control power supply voltage $V_{BAT12\_CTRL}$ is the normal control supply power voltage $V_{BAT12\_CTRL\_NORMAL}$, the bias circuit 200B_1 may generate a normal bias current $I_{BIAS1\_B\_NORMAL}$. The abnormal bias current $I_{BIAS1\_B\_ABNORMAL}$ has a lower current value than the normal bias current $I_{BIAS1\_B\_NORMAL}$. Due to the abnormal bias current $I_{BIAS1\_B\_ABNORMAL}$ having a low current value, the power transistor 100_1 performs an amplification operation with a low gain, and the power amplifier 1000B may be protected from an excessive peak voltage. As an example, the abnormal bias current $I_{BIAS1\_B\_ABNORMAL}$ may be 0 mA. When the abnormal bias current $I_{BIAS1\_B\_ABNORMAL}$ is 0 mA, the power transistor 100_1 does not perform an amplification operation, so the power amplifier 1000B may be protected from an excessive peak voltage.

When the control power supply voltage $V_{BAT12\_CTRL}$ is the abnormal control power supply voltage $V_{BAT12\_CTRL\_ABNORMAL}$, the bias circuit 200B_2 may generate an abnormal bias current $I_{BIAS2\_B\_ABNORMAL}$. When the control power supply voltage $V_{BAT12\_CTRL}$ is the normal control supply power voltage $V_{BAT12\_CTRL\_NORMAL}$, the bias circuit 200B_2 may generate a normal bias current $I_{BIAS2\_B\_NORMAL}$. The abnormal bias current $I_{BIAS2\_B\_ABNORMAL}$ has a lower current value than the normal bias current $I_{BIAS2\_B\_NORMAL}$. Due to the abnormal bias current $I_{BIAS2\_B\_ABNORMAL}$ having a low current value, the power transistor 100_2 performs an amplification operation with a low gain, and the power amplifier 1000B may be protected from an excessive peak voltage. That is, not only the power transistor 100_1 but also the power transistor 100_2 performs an amplification operation with a low gain, and the power amplifier 1000B may be further protected from an excessive peak voltage. As an example, the abnormal bias current $I_{BIAS2\_B\_ABNORMAL}$ may be 0 mA. When the abnormal bias current $I_{BIAS2\_B\_ABNORMAL}$ is 0 mA, the power transistor 100_2 does not perform an amplification operation, so the power amplifier 1000B may be protected from an excessive peak voltage.

Figure 8:
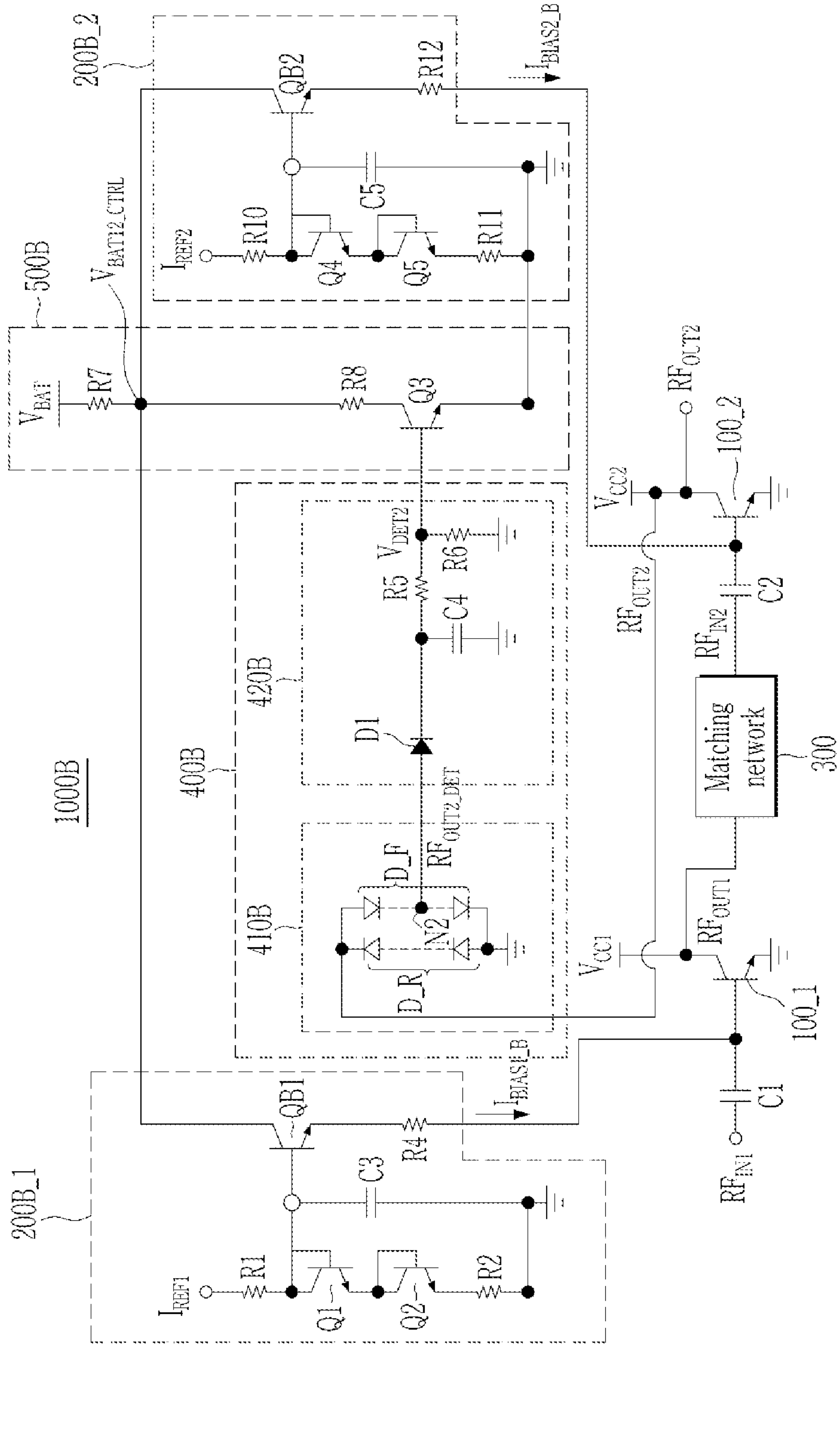
FIG. 8 is a circuit diagram showing internal configurations of a bias circuit 200B_1, a signal detection circuit 400B, a power supply voltage control circuit 500B, and a bias circuit 200B_2 of FIG. 7.

FIG. 8 is a circuit diagram showing internal configurations of the bias circuit 200B_1, the signal detection circuit 400B, the power supply voltage control circuit 500B, and the bias circuit 200B_2 of FIG. 7.

As shown in FIG. 8, the bias circuit 200B_1 may include a transistor Q1, a transistor Q2, a transistor QB1, a resistor R1, a resistor R2, a resistor R4, and a capacitor C3. Since the bias circuit 200B_1 of FIG. 8 is similar to the bias circuit 200A_1 of FIG. 2 except for the connection relationship of the transistor QB1, overlapping descriptions may be omitted.

A collector of the transistor QB1 may receive the control power supply voltage $V_{BAT12\_CTRL}$. That is, the collector of the transistor QB1 may be connected to the node where the resistor R7 and the resistor R8 are connected to each other. A base of the transistor QB1 may be connected to a base of the transistor Q1. An emitter of the transistor QB1 may be connected to the input terminal (for example, the base) of the power transistor 100_1 through the resistor R4. The current flowing through the emitter of the transistor QB1 is the bias current $I_{BIAS1\_B}$ described with respect to FIG. 7 above. The collector of the transistor QB1 is a terminal that receives the control power supply voltage $V_{BAT12\_CTRL}$, which is a power supply voltage, and the emitter of the transistor QB1 is a terminal that supplies the bias current $I_{BIAS1\_B}$ to the power transistor 100_1.

As shown in FIG. 8, the signal detection circuit 400B according to another example may include an electrostatic discharge (ESD) protection circuit 410B and an envelope detection circuit 420B. The signal detection circuit 400B of FIG. 8 is similar to the signal detection circuit 400A of FIG. 3 except that it detects the magnitude of the output RF signal $RF_{OUT2}$ and generates the detection voltage $V_{DET2}$. Accordingly, overlapping descriptions may be omitted.

Since the power supply voltage $V_{CC2}$ is supplied from an external source to the output terminal of the power transistor 100_2, the electrostatic discharge protection circuit 410B may be connected between the output terminal (for example, the collector) of the power transistor 100_2 and the ground. As shown in FIG. 8, the electrostatic discharge protection circuit 410B according to another example may include a plurality of forward-biased diodes D_F and a plurality of reversed-biased diodes D_R. When an excessive voltage or current is input, the plurality of forward-biased diodes D_F or the plurality of reversed-biased diodes D_R is turned on. Accordingly, the power transistor 100_2 may be protected. The plurality of forward-biased diodes D_F includes a plurality of diodes connected in series in a forward direction, and the plurality of reversed-biased diodes D_R includes a plurality of diodes connected in series in a reverse direction. In FIG. 8, a node where at least two diodes are connected to each other among the plurality of forward-biased diodes D_F is indicated as "node N2".

The envelope detection circuit 420B may detect the envelope of the RF signal corresponding to the output RF signal $RF_{OUT2}$ and may generate the detection voltage $V_{DET2}$ corresponding to the detected envelope. As shown in FIG. 8, the envelope detection circuit 420B according to another example may include a diode D1, a capacitor C4, a resistor R5, and a resistor R6.

An anode of the diode D1 may be connected to the node N2, and the voltage at the node where the resistor R5 and the resistor R6 are connected to each other corresponds to the detection voltage $V_{DET2}$ described above. When the electrostatic discharge protection circuit 410B does not operate (that is, the plurality of forward-biased diodes D_F and the plurality of reversed-biased diodes D_R do not turn on), an RF signal corresponding to the output RF signal $RF_{OUT2}$ may appear (that is, be generated) at the node N2. In FIG. 8, the RF signal appearing at the node N2 is indicated as "detection RF signal $RF_{OUT2\_DET}$."

Since the electrostatic discharge protection circuit 410B has an infinite impedance (that is, it is in an open state), the detection RF signal $RF_{OUT2\_DET}$ may not affect the output RF signal $RF_{OUT2}$.

The detection RF signal $RF_{OUT2\_DET}$ is input to the envelope detection circuit 420B. The diode D1 and the capacitor C4 of the envelope detection circuit 420B operate as a rectifier circuit. That is, the envelope of the detection RF signal $RF_{OUT2\_DET}$ may be detected by the diode D1 and the capacitor C4. The detected envelope is divided by the resistor R5 and the resistor R6, and the detection voltage $V_{DET2}$ corresponding to the detected envelope may be generated. That is, the envelope detection circuit 420B converts the detection RF signal $RF_{OUT2\_DET}$ into the detection voltage $V_{DET2}$. The level of the detection voltage $V_{DET2}$ may be adjusted by the values of the resistor R5 and the resistor R6.

When the magnitude of the input RF signal $RF_{IN2}$ increases, the magnitude of the output RF signal $RF_{OUT2}$ also increases. When the magnitude of the output RF signal $RF_{OUT2}$ increases, the magnitude of the detection RF signal $RF_{OUT2\_DET}$ also increases. Due to an increase in the magnitude of the detection RF signal $RF_{OUT2\_DET}$, the detection voltage $V_{DET2}$ also increases. In other words, the detection voltage $V_{DET2}$ increases in proportion to the magnitude of the input RF signal $RF_{IN2}$.

As shown in FIG. 8, the power supply voltage control circuit 500B may include a transistor Q3, a resistor R7, and a resistor R8.

A base of the transistor Q3 may be connected to the other end of the resistor R5 and may receive the detection voltage $V_{DET2}$. That is, the base of the transistor Q3 may be connected to the node where the resistor R5 and the resistor R6 are connected to each other. An emitter of the transistor Q3 may be connected to the ground. A collector of the transistor Q3 may be connected to the power supply voltage $V_{BAT}$ through the resistor R8 and the resistor R7.

One end of the resistor R7 may be connected to the power supply voltage $V_{BAT}$, and the resistor R8 may be connected between the other end of the resistor R7 and the collector of the transistor Q3. The voltage at the node where the resistor R7 and the resistor R8 are connected to each other is the control power supply voltage $V_{BAT12\_CTRL}$ described above. The control power supply voltage $V_{BAT12\_CTRL}$ may change depending on whether the transistor Q3 is turned on. Since the detection voltage $V_{DET2}$ is input to the base of the transistor Q3, the transistor Q3 may be turned on or off depending on the level of the detection voltage $V_{DET2}$.

When the detection voltage $V_{DET2}$ is above a predetermined level, the transistor Q3 turns on. When the detection voltage $V_{DET2}$ is above the predetermined level, the output RF signal $RF_{OUT2}$ is excessive (abnormal). That is, this is a case in which the protection operation is performed. When performing a protection operation, the magnitude of the output RF signal $RF_{OUT2}$ may be set in advance, and the level of the corresponding detection voltage $V_{DET2}$ may be adjusted according to the values of the resistor R5 and the resistor R6.

When the transistor Q3 is turned on, the control power supply voltage $V_{BAT12\_CTRL}$ may have the third voltage level. That is, the control power supply voltage $V_{BAT12\_CTRL}$ becomes the abnormal control power supply voltage $V_{BAT12\_CTRL\_ABNORMAL}$. Similar to Equation 1 above, the abnormal control power supply voltage $V_{BAT12\_CTRL\_ABNORMAL}$ may have a value expressed by Equation 3 below.

$$V_{BAT12\_CTRL\_ABNORMAL} = \frac{R8}{R7 + R8} \cdot V_{BAT} \quad (3)$$

In Equation 3 above, it is assumed that the collector-emitter voltage of the transistor Q3 is 0 V when the transistor Q3 is turned on.

When the detection voltage $V_{DET2}$ is below the predetermined level, the transistor Q3 turns off. When the detection voltage $V_{DET2}$ is less than the predetermined level, the output RF signal $RF_{OUT2}$ is not excessive (normal). That is, this is a case in which the protection operation is not performed.

When the transistor Q3 is turned off, the control power supply voltage $V_{BAT12\_CTRL}$ may have the fourth voltage level. That is, the control power supply voltage $V_{BAT12\_CTRL}$ becomes the normal control power voltage $V_{BAT12\_CTRL\_NORMAL}$. Similar to Equation 2 above, the normal control power supply voltage $V_{BAT12\_CTRL\_NORMAL}$ may have a value expressed by Equation 4 below.

$$V_{BAT12\_CTRL\_NORMAL} = V_{BAT} - I_{R7} \cdot R7 \quad (4)$$

In Equation 4 above, $I_{R7}$ represents the current flowing through the resistor R7 when the transistor Q3 is turned off.

Referring to Equations 3 and 4 above, the abnormal control power supply voltage $V_{BAT12\_CTRL\_ABNORMAL}$ has a lower value than the normal control power supply voltage $V_{BAT12\_CTRL\_NORMAL}$. When the protection operation is performed, the transistor Q3 is turned on, which causes the control power supply voltage $V_{BAT12\_CTRL}$ to decrease (become lower). That is, the third voltage level is a voltage level lower than the fourth voltage level.

As shown in FIG. 8, the bias circuit 200B_2 may include a transistor Q4, a transistor Q5, a transistor QB2, a resistor R10, a resistor R11, a resistor R12, and a capacitor C5.

A collector of the transistor QB2 may receive the control power supply voltage $V_{BAT12\_CTRL}$. That is, the collector of the transistor QB2 may be connected to the node where the resistor R7 and the resistor R8 are connected to each other. A base of the transistor QB2 may be connected to the base of the transistor Q4. An emitter of the transistor QB2 may be connected to the input terminal (for example, the base) of the power transistor 100_2 through the resistor R12. The current flowing through the emitter of the transistor QB2 is the bias current $I_{BIAS2\_B}$ described with respect to FIG. 7. The collector of the transistor QB2 is a terminal that receives the control power supply voltage $V_{BAT12\_CTRL}$, which is a power supply voltage, and the emitter of the transistor QB2 is a terminal that supplies the bias current $I_{BIAS2\_B}$ to the power transistor 100_2.

In FIG. 8, the bias current $I_{BIAS1\_B}$ and the bias current $I_{BIAS2\_B}$ may change based on the control power supply voltage $V_{BAT12\_CTRL}$. When the control power supply voltage $V_{BAT12\_CTRL}$ decreases (becomes lower), the bias current $I_{BIAS1\_B}$ and the bias current $I_{BIAS2\_B}$ also decrease. As an example, when the control power supply voltage $V_{BAT12\_CTRL}$ is lower than a predetermined threshold voltage, the transistor QB1 and the transistor QB2 do not operate (that is, the transistor QB1 and the transistor QB2 are turned off), which may cause the bias current $I_{BIAS1\_B}$ and the bias current $I_{BIAS2\_B}$ to be 0 mA.

When the control power supply voltage $V_{BAT12\_CTRL}$ is the normal control power supply voltage $V_{BAT12\_CTRL\_NORMAL}$, the transistor QB1 and the transistor QB2 receive a normal power voltage. Due to this, the bias current $I_{BIAS1\_B}$ and the bias current $I_{BIAS2\_B}$ also have a normal value. In other words, the bias circuit 200B_1 generates the normal bias current $I_{BIAS1\_B\_NORMAL}$ and the bias circuit 200B_2 generates the normal bias current $I_{BIAS2\_B\_NORMAL}$. Due to the normal bias current $I_{BIAS1\_B\_NORMAL}$ and the normal bias current $I_{BIAS2\_A\_NORMAL}$, the power transistor 100_1 and the power transistor 100_2 may perform a normal amplification operation.

When the transistor Q3 is turned on due to an excessive output RF signal $RF_{OUT2}$, the control power supply voltage $V_{BAT12\_CTRL}$ becomes the abnormal control power supply voltage $V_{BAT12\_CTRL\_ABNORMAL}$. The transistor QB1 and the transistor QB2 receive the abnormal control power supply voltage $V_{BAT12\_CTRL\_ABNORMAL}$, which reduces the bias current $I_{BIAS1\_B}$ and the bias current $I_{BIAS2\_B}$. In other words, the bias circuit 200B_1 generates the abnormal bias current $I_{BIAS1\_B\_ABNORMAL}$ and the bias circuit 200B_2 generates the abnormal bias current $I_{BIAS2\_B\_ABNORMAL}$. Due to the abnormal bias current $I_{BIAS1\_B\_ABNORMAL}$ and the abnormal bias current $I_{BIAS2\_B\_ABNORMAL}$, the peak voltages applied to the power transistor 100_1 and the power transistor 100_2 do not exceed a breakdown voltage. Through this, the power amplifier 1000B may be protected from excessive RF signals.

The power amplifier 1000B according to another example performs the protection operation only when the output RF signal $RF_{OUT2}$ is excessive (that is, abnormal) and does not perform the protection operation otherwise. That is, the transistor Q3 of FIG. 8 is turned on only when the output RF signal $RF_{OUT2}$ is excessive (that is, abnormal); otherwise it remains turned off. Since the transistor Q3 does not continuously turn on and off, spurs due to oscillation may not occur.

In FIG. 8, the electrostatic discharge protection circuit 410B may be replaced with a capacitor. That is, as described with respect to FIG. 6, the electrostatic discharge protection circuit 410B may be replaced with a capacitor that couples and outputs a portion of the output RF signal $RF_{OUT2}$ to the anode of the diode D1 as a detection RF signal.

Figure 9:
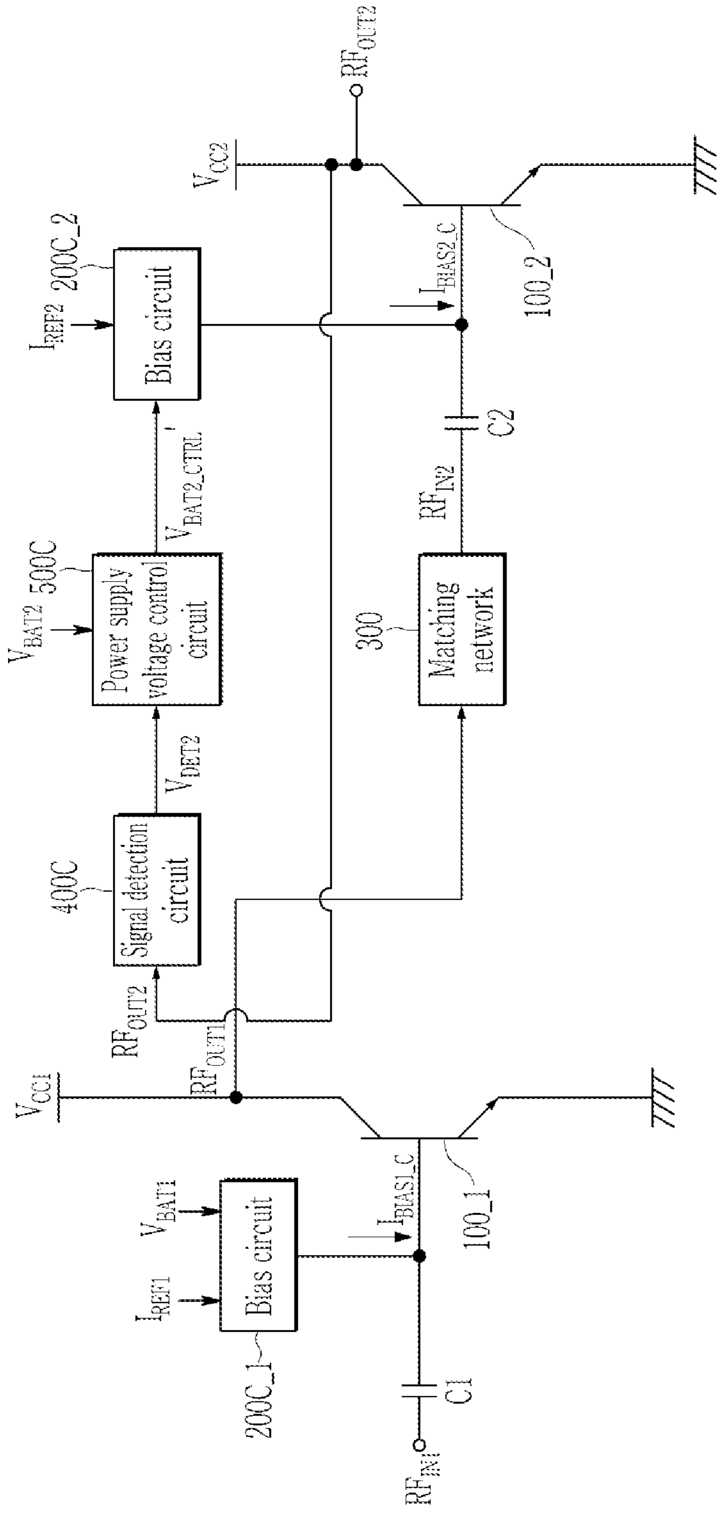
FIG. 9 illustrates a power amplifier 1000C according to another example.

FIG. 9 illustrates a power amplifier 1000C according to another example.

As shown in FIG. 9, the power amplifier 1000C according to another example may include a power transistor 100_1, a bias circuit 200C_1, a capacitor C1, a power transistor 100_2, a bias circuit 200C_2, a capacitor C2, and a matching network 300. Since the power amplifier 1000C of FIG. 9 is similar to the power amplifier 1000A of FIG. 1 and the power amplifier 1000B of FIG. 7, overlapping descriptions may be omitted.

The bias circuit 200C_1 may receive a reference current $I_{REF1}$ and a power supply voltage $V_{BAT1}$ from an external source. The bias circuit 200C_1 may generate a bias current $I_{BIAS1\_C}$ required by the power transistor 100_1 using the reference current $I_{REF1}$ and the power supply voltage $V_{BAT1}$. The bias current $I_{BIAS1\_C}$ is supplied to the input terminal (for example, the base) of the power transistor 100_1, and the bias level (a bias point) of the power transistor 100_1 may be set by the bias current $I_{BIAS1\_C}$.

The bias circuit 200C_2 may receive a control power supply voltage $V_{BAT2\_CTRL}'$ from a power supply voltage control circuit 500C and may receive a reference current $I_{REF2}$ from an external source. The bias circuit 200C_2 may generate a bias current $I_{BIAS2\_C}$ required by the power transistor 100_2 using the control power supply voltage $V_{BAT2\_CTRL}'$ and the reference current $I_{REF2}$. The bias current $I_{BIAS2\_C}$ is supplied to the input terminal (for example, the base) of the power transistor 100_2, and the bias level (a bias point) of the power transistor 100_2 may be set by the bias current $I_{BIAS2\_C}$.

When an excessive peak voltage is applied to an element (for example, the power transistor 100_2) included in the power amplifier 1000C (that is, in an abnormal state), the power amplifier 1000C according to another example performs a protection operation. To perform this protection operation, the power amplifier 1000C according to another example may further include a signal detection circuit 400C and the power supply voltage control circuit 500C.

The signal detection circuit 400C may receive the output RF signal $RF_{OUT2}$ and detect the magnitude of the output RF signal $RF_{OUT2}$. The magnitude of the output RF signal $RF_{OUT2}$ may correspond to the peak voltage of the output RF signal $RF_{OUT2}$ or may correspond to the power of the output RF signal $RF_{OUT2}$. The signal detection circuit 400C may generate a detection voltage $V_{DET2}$ corresponding to the magnitude of the output RF signal $RF_{OUT2}$. In more detail, the signal detection circuit 400C may detect the envelope of the output RF signal $RF_{OUT2}$ and generate and output the detection voltage $V_{DET2}$ corresponding to the detected envelope. That is, the signal detection circuit 400C of FIG. 9 is similar to the signal detection circuit 400B of FIG. 7. The specific configuration and operation of the signal detection circuit 400C will be described in detail with respect to FIG. 10.

The power supply voltage control circuit 500C may receive a power supply voltage $V_{BAT2}$ from an external source and receive the detection voltage $V_{DET2}$ from the signal detection circuit 400C. The power supply voltage control circuit 500C uses the power supply voltage $V_{BAT2}$ and the detection voltage $V_{DET2}$ to generate a control power supply voltage $V_{BAT2\_CTRL}'$, and the generated control power supply voltage $V_{BAT2\_CTRL}'$ may be output to the bias circuit 200C_2. That is, the power supply voltage control circuit 500C can adjust (change) the control power supply voltage $V_{BAT2\_CTRL}'$, which is a power supply voltage to be supplied to the bias circuit 200C_2, in response to the detection voltage $V_{DET2}$.

Similar to the control power supply voltage $V_{BAT2\_CTRL}$ of FIG. 1, the control power supply voltage $V_{BAT2\_CTRL}'$ of FIG. 9 may have two voltage levels. When the detection voltage $V_{DET2}$ has a value higher than a predetermined voltage level, the power supply voltage control circuit 500C may generate the control power supply voltage $V_{BAT2\_CTRL}'$ having a fifth voltage level. When the detection voltage $V_{DET2}$ has a value less than the predetermined voltage level, the power supply voltage control circuit 500C may generate the control power supply voltage $V_{BAT2\_CTRL}'$ having a sixth voltage level. The fifth voltage level may be a voltage level lower than the sixth voltage level. When the output RF signal $RF_{OUT2}$ is excessive, the detection voltage $V_{DET2}$ has a value above the predetermined voltage level, so hereinafter, the control power supply voltage $V_{BAT2\_CTRL}'$ having the fifth voltage level is referred to as "abnormal control power supply voltage $V_{BAT2\_CTRL\_ABNORMAL}$'". When the output RF signal $RF_{OUT2}$ is not excessive, the detection voltage $V_{DET2}$ has a value below the predetermined voltage level, so hereinafter, the control power supply voltage $V_{BAT2\_CTRL}'$ having the sixth voltage level is referred to as "normal control power supply voltage $V_{BAT2\_CTRL\_NORMAL}$'".

When the control power supply voltage $V_{BAT2\_CTRL}'$ is the abnormal control power supply voltage $V_{BAT2\_CTRL\_ABNORMAL}'$, the bias circuit 200C_2 may generate an abnormal bias current $I_{BIAS2\_C\_ABNORMAL}$. When the control power supply voltage $V_{BAT2\_CTRL}'$ is the normal control supply power voltage $V_{BAT2\_CTRL\_NORMAL}'$, the bias circuit 200C_2 may generate a normal bias current $I_{BIAS2\_C\_NORMAL}$. The abnormal bias current $I_{BIAS2\_C\_ABNORMAL}$ has a lower current value than the normal bias current $I_{BIAS2\_C\_NORMAL}$. Due to the abnormal bias current $I_{BIAS2\_C\_ABNORMAL}$ having a low current value, the power transistor 100_2 performs an amplification operation with a low gain, and the power amplifier 1000C may be protected from an excessive peak voltage. As an example, the abnormal bias current $I_{BIAS2\_C\_ABNORMAL}$ may be 0 mA. When the abnormal bias current $I_{BIAS2\_C\_ABNORMAL}$ is 0 mA, the power transistor 100_2 does not perform an amplification operation, so the power amplifier 1000C may be protected from an excessive peak voltage.

Figure 10:
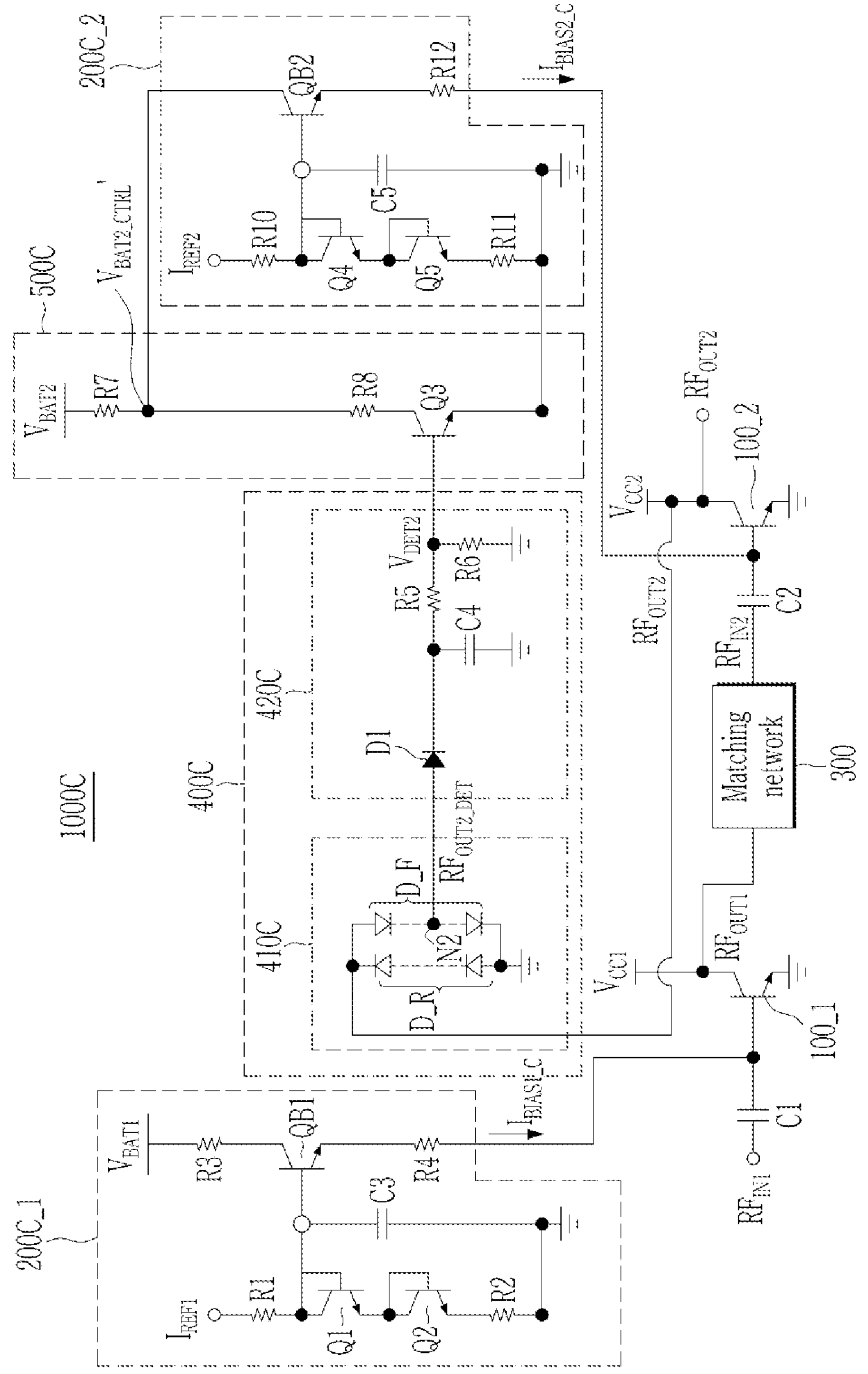
FIG. 10 is a circuit diagram showing internal configurations of a bias circuit 200C_1, a signal detection circuit 400C, a power supply voltage control circuit 500C, and a bias circuit 200C_2 of FIG. 9.

FIG. 10 is a circuit diagram showing internal configurations of the bias circuit 200C_1, the signal detection circuit 400C, the power supply voltage control circuit 500C, and the bias circuit 200C_2 of FIG. 9.

As shown in FIG. 10, the bias circuit 200C_1 may include a transistor Q1, a transistor Q2, a transistor QB1, a resistor R1, a resistor R2, a resistor R3, a resistor R4, and a capacitor C3. Since the bias circuit 200C_1 of FIG. 10 is the same as the bias circuit 200A_1 of FIG. 2, a detailed description may be omitted.

The signal detection circuit 400C may include an electrostatic discharge (ESD) protection circuit 410C and an envelope detection circuit 420C. Since the specific configuration and operation of the signal detection circuit 400C are the same as those of the signal detection circuit 400B of FIG. 8, a detailed description may be omitted. The electrostatic discharge protection circuit 410C may include a plurality of forward-biased diodes D_F and a plurality of reverse-biased diodes D_R, and a detection RF signal $RF_{OUT2\_DET}$ may be output from the node N2. In addition, the envelope detection circuit 420C may include a diode D1, a capacitor C4, a resistor R5, and a resistor R6. At the node where the resistor R5 and the resistor R6 are connected to each other, the detection voltage $V_{DET2}$ may be generated (output).

As shown in FIG. 10, the power supply voltage control circuit 500C may include a transistor Q3, a resistor R7, and a resistor R8.

A base of the transistor Q3 may be connected to the other end of the resistor R5 and may receive the detection voltage $V_{DET2}$. That is, the base of the transistor Q3 may be connected to the node where the resistor R5 and the resistor R6 are connected to each other. An emitter of the transistor Q3 may be connected to the ground. A collector of the transistor Q3 may be connected to the power supply voltage $V_{BAT2}$ through the resistor R8 and the resistor R7.

One end of the resistor R7 may be connected to the power supply voltage $V_{BAT2}$, and the resistor R8 may be connected between the other end of the resistor R7 and the collector of the transistor Q3. The voltage at the node where the resistor R7 and the resistor R8 are connected to each other is the control power supply voltage $V_{BAT2\_CTRL}'$ described above. The control power supply voltage $V_{BAT2\_CTRL}'$ may change depending on whether the transistor Q3 is turned on. Since the detection voltage $V_{DET2}$ is input to the base of the transistor Q3, the transistor Q3 may be turned on or off depending on the level of the detection voltage $V_{DET2}$.

When the detection voltage $V_{DET2}$ is above a predetermined level, the transistor Q3 turns on. When the detection voltage $V_{DET2}$ is above the predetermined level, the output RF signal $RF_{OUT2}$ is excessive (abnormal). That is, this is a case in which the protection operation is performed. When performing a protection operation, the magnitude of the output RF signal $RF_{OUT2}$ may be set in advance, and the level of the corresponding detection voltage $V_{DET2}$ may be adjusted according to the values of the resistor R5 and the resistor R6.

When the transistor Q3 is turned on, the control power supply voltage $V_{BAT2\_CTRL}'$ may have the fifth voltage level. That is, the control power supply voltage $V_{BAT2\_CTRL}'$ becomes the abnormal control power supply voltage $V_{BAT2\_CTRL\_ABNORMAL}'$. The abnormal control power supply voltage $V_{BAT2\_CTRL\_ABNORMAL}'$ may have the same value as $V_{BAT2\_CTRL\_ABNORMAL}$ expressed by Equation 1 above.

When the detection voltage $V_{DET2}$ is below the predetermined level, the transistor Q3 turns off. When the detection voltage $V_{DET2}$ is less than the predetermined level, the output RF signal $RF_{OUT2}$ is not excessive (normal). That is, this is a case in which the protection operation is not performed.

When the transistor Q3 is turned off, the control power supply voltage $V_{BAT2\_CTRL}'$ may have the sixth voltage level. That is, the control power supply voltage $V_{BAT2\_CTRL}'$ becomes the normal control power voltage $V_{BAT2\_CTRL\_NORMAL}'$. The abnormal control power supply voltage $V_{BAT2\_CTRL\_NORMAL}'$ may have the same value as $V_{BAT2\_CTRL\_NORMAL}$ expressed by Equation 2 above.

The abnormal control power supply voltage $V_{BAT2\_CTRL\_ABNORMAL}'$ has a lower value than the normal control power supply voltage $V_{BAT2\_CTRL\_NORMAL}'$. When the protection operation is performed, the transistor Q3 is turned on, which causes the control power supply voltage $V_{BAT2\_CTRL}'$ to decrease (become lower). That is, the fifth voltage level is a voltage level lower than the sixth voltage level.

As shown in FIG. 10, the bias circuit 200C_2 may include a transistor Q4, a transistor Q5, a transistor QB2, a resistor R10, a resistor R11, a resistor R12, and a capacitor C5.

A collector of the transistor QB2 may receive the control power supply voltage $V_{BAT2\_CTRL}'$. That is, the collector of the transistor QB2 may be connected to the node where the resistor R7 and the resistor R8 are connected to each other. A base of the transistor QB2 may be connected to the base of the transistor Q4. An emitter of the transistor QB2 may be connected to the input terminal (for example, the base) of the power transistor 100_2 through the resistor R12. The current flowing through the emitter of the transistor QB2 is the bias current $I_{BIAS2\_C}$ described with respect to FIG. 9. The collector of the transistor QB2 is a terminal that receives the control power supply voltage $V_{BAT2\_CTRL}'$, which is a power supply voltage, and the emitter of the transistor QB2 is a terminal that supplies the bias current $I_{BIAS2\_C}$ to the power transistor 100_2.

In FIG. 10, the bias current $I_{BIAS2\_C}$ may change based on the control power supply voltage $V_{BAT2\_CTRL}'$. When the control power supply voltage $V_{BAT2\_CTRL}'$ decreases (becomes lower), the bias current $I_{BIAS2\_C}$ also decreases. As an example, when the control power supply voltage $V_{BAT2\_CTRL}'$ is lower than a predetermined threshold voltage, the transistor QB2 does not operate (that is, the transistor QB2 is turned off), which may cause the bias current $I_{BIAS2\_C}$ to be 0 mA.

When the control power supply voltage $V_{BAT2\_CTRL}'$ is the normal control power supply voltage $V_{BAT2\_CTRL\_NORMAL}'$, the transistor QB2 receives a normal power voltage. Due to this, the bias current $I_{BIAS2\_C}$ also has a normal value. In other words, the bias circuit 200C_2 generates the normal bias current $I_{BIAS2\_C\_NORMAL}$. Due to the normal bias current $I_{BIAS2\_C\_NORMAL}$, the power transistor 100_2 may perform a normal amplification operation.

When the transistor Q3 is turned on due to an excessive output RF signal $RF_{OUT2}$, the control power supply voltage $V_{BAT2\_CTRL}'$ becomes the abnormal control power supply voltage $V_{BAT2\_CTRL\_ABNORMAL}'$. The transistor QB2 receives the abnormal control power supply voltage $V_{BAT2\_CTRL\_ABNORMAL}'$, which reduces the bias current $I_{BIAS2\_C}$. In other words, the bias circuit 200C_2 generates the abnormal bias current $I_{BIAS2\_C\_ABNORMAL}$. Due to the abnormal bias current $I_{BIAS2\_C\_ABNORMAL}$, the peak voltage applied to the power transistor 100_2 does not exceed a breakdown voltage. Through this, the power amplifier 1000C may be protected from excessive RF signals.

The power amplifier 1000C according to another example performs the protection operation only when the output RF signal $RF_{OUT2}$ is excessive (that is, abnormal) and does not perform the protection operation otherwise. That is, the transistor Q3 of FIG. 10 is turned on only when the output RF signal $RF_{OUT2}$ is excessive (that is, abnormal); otherwise it remains turned off. Since the transistor Q3 does not continuously turn on and off, spurs due to oscillation may not occur.

In FIG. 10, the electrostatic discharge protection circuit 410C may be replaced with a capacitor. That is, as described with respect to FIG. 6, the electrostatic discharge protection circuit 410C may be replaced with a capacitor that couples and outputs a portion of the output RF signal $RF_{OUT2}$ to the anode of the diode D1 as a detection RF signal.

Figure 11:
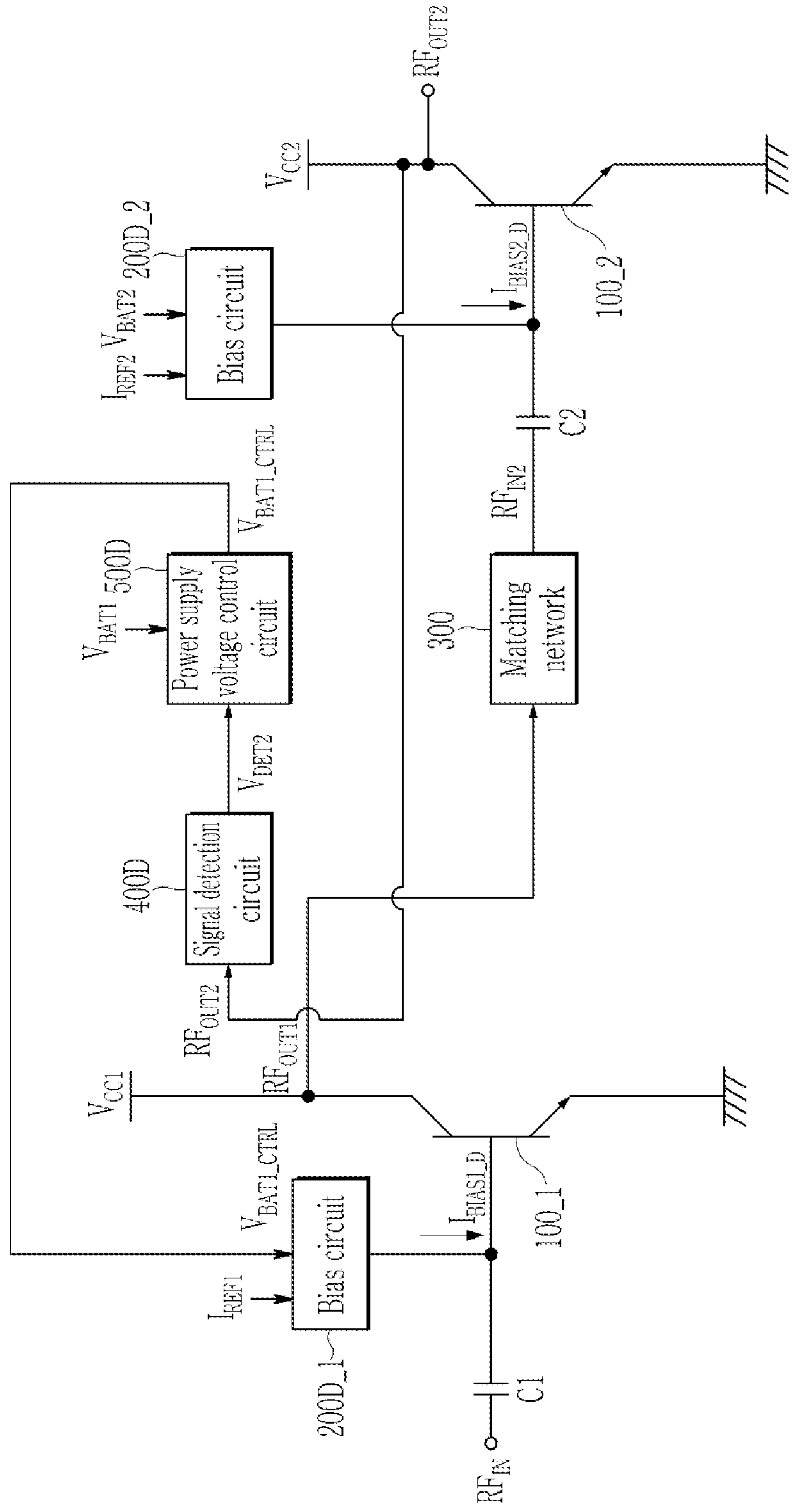
FIG. 11 illustrates a power amplifier 1000D according to another example.

FIG. 11 illustrates a power amplifier 1000D according to another example.

As shown in FIG. 11, the power amplifier 1000D according to another example may include a power transistor 100_1, a bias circuit 200D_1, a capacitor C1, a power transistor 100_2, a bias circuit 200D_2, a capacitor C2, and a matching network 300. Since the power amplifier 1000D of FIG. 11 is similar to the power amplifier 1000A of FIG. 1, the power amplifier 1000B of FIG. 7, and the power amplifier 1000C of FIG. 9, overlapping descriptions may be omitted.

The bias circuit 200D_1 may receive a control power supply voltage $V_{BAT1\_CTRL}$ from a power supply voltage control circuit 500D and may receive the reference current $I_{REF1}$ from an external source. The bias circuit 200D_1 may generate a bias current $I_{BIAS1\_D}$ required by the power transistor 100_1 using the control power supply voltage $V_{BAT1\_CTRL}$ and the reference current $I_{REF1}$. The bias current $I_{BIAS1\_D}$ is supplied to the input terminal (for example, the base) of the power transistor 100_1, and the bias level (a bias point) of the power transistor 100_1 may be set by the bias current $I_{BIAS1\_D}$.

The bias circuit 200D_2 may receive a reference current $I_{REF2}$ and a power supply voltage $V_{BAT2}$ from an external source. The bias circuit 200D_2 may generate a bias current $I_{BIAS2\_D}$ required by the power transistor 100_2 using the reference current $I_{REF2}$ and the power supply voltage $V_{BAT2}$. The bias current $I_{BIAS2\_D}$ is supplied to the input terminal (for example, the base) of the power transistor 100_2, and the bias level (a bias point) of the power transistor 100_2 may be set by the bias current $I_{BIAS2\_D}$.

When an excessive peak voltage is applied to an element (for example, the power transistor 100_2) included in the power amplifier 1000D (that is, in an abnormal state), the power amplifier 1000D according to another example performs a protection operation. To perform this protection operation, the power amplifier 1000D according to another example may further include a signal detection circuit 400D and the power supply voltage control circuit 500D.

The signal detection circuit 400D may receive the output RF signal $RF_{OUT2}$ and detect the magnitude of the output RF signal $RF_{OUT2}$. The magnitude of the output RF signal $RF_{OUT2}$ may correspond to the peak voltage of the output RF signal $RF_{OUT2}$ or may correspond to the power of the output RF signal $RF_{OUT2}$. The signal detection circuit 400D may generate a detection voltage $V_{DET2}$ corresponding to the magnitude of the output RF signal $RF_{OUT2}$. In more detail, the signal detection circuit 400D may detect the envelope of the output RF signal $RF_{OUT2}$ and generate and output the detection voltage $V_{DET2}$ corresponding to the detected envelope. That is, the signal detection circuit 400D of FIG. 11 is similar to the signal detection circuit 400B of FIG. 7 and the signal detection circuit 400C of FIG. 9. The specific configuration and operation of the signal detection circuit 400D will be described in detail with respect to FIG. 12.

The power supply voltage control circuit 500D may receive a power supply voltage $V_{BAT1}$ from an external source and receive the detection voltage $V_{DET2}$ from the signal detection circuit 400D. The power supply voltage control circuit 500D uses the power supply voltage $V_{BAT1}$ and the detection voltage $V_{DET2}$ to generate a control power supply voltage $V_{BAT1\_CTRL}$, and the generated control power supply voltage $V_{BAT1\_CTRL}$ may be output to the bias circuit 200D_1. That is, the power supply voltage control circuit 500D can adjust (change) the control power supply voltage $V_{BAT1\_CTRL}$, which is a power supply voltage to be supplied to the bias circuit 200D_1, in response to the detection voltage $V_{DET2}$.

The control power supply voltage $V_{BAT1\_CTRL}$ of FIG. 11 may have two voltage levels. When the detection voltage $V_{DET2}$ has a value higher than a predetermined voltage level, the power supply voltage control circuit 500D may generate the control power supply voltage $V_{BAT1\_CTRL}$ having a seventh voltage level. When the detection voltage $V_{DET2}$ has a value less than the predetermined voltage level, the power supply voltage control circuit 500D may generate the control power supply voltage $V_{BAT1\_CTRL}$ having an eighth voltage level. The eighth voltage level may be a voltage level lower than the seventh voltage level. When the output RF signal $RF_{OUT2}$ is excessive, the detection voltage $V_{DET2}$ has a value above the predetermined voltage level, so hereinafter, the control power supply voltage $V_{BAT1\_CTRL}$ having the seventh voltage level is referred to as "abnormal control power supply voltage $V_{BAT1\_CTRL\_ABNORMAL}$". When the output RF signal $RF_{OUT2}$ is not excessive, the detection voltage $V_{DET2}$ has a value below the predetermined voltage level, so hereinafter, the control power supply voltage $V_{BAT1\_CTRL}$ having the eighth voltage level is referred to as "normal control power supply voltage $V_{BAT1\_CTRL\_NORMAL}$".

When the control power supply voltage $V_{BAT1\_CTRL}$ is the abnormal control power supply voltage $V_{BAT1\_CTRL\_ABNORMAL}$, the bias circuit 200D_1 may generate an abnormal bias current $I_{BIAS1\_D\_ABNORMAL}$. When the control power supply voltage $V_{BAT1\_CTRL}$ is the normal control supply power voltage $V_{BAT1\_CTRL\_NORMAL}$, the bias circuit 200D_1 may generate a normal bias current $I_{BIAS1\_D\_NORMAL}$. The abnormal bias current $I_{BIAS1\_D\_ABNORMAL}$ has a lower current value than the normal bias current $I_{BIAS1\_D\_NORMAL}$. Due to the abnormal bias current $I_{BIAS1\_D\_ABNORMAL}$ having a low current value, the power transistor 100_1 performs an amplification operation with a low gain, and the power amplifier 1000D may be protected from an excessive peak voltage. As an example, the abnormal bias current $I_{BIAS1\_D\_ABNORMAL}$ may be 0 mA. When the abnormal bias current $I_{BIAS1\_D\_ABNORMAL}$ is 0 mA, the power transistor 100_1 does not perform an amplification operation, so the power amplifier 1000D may be protected from an excessive peak voltage.

Figure 12:
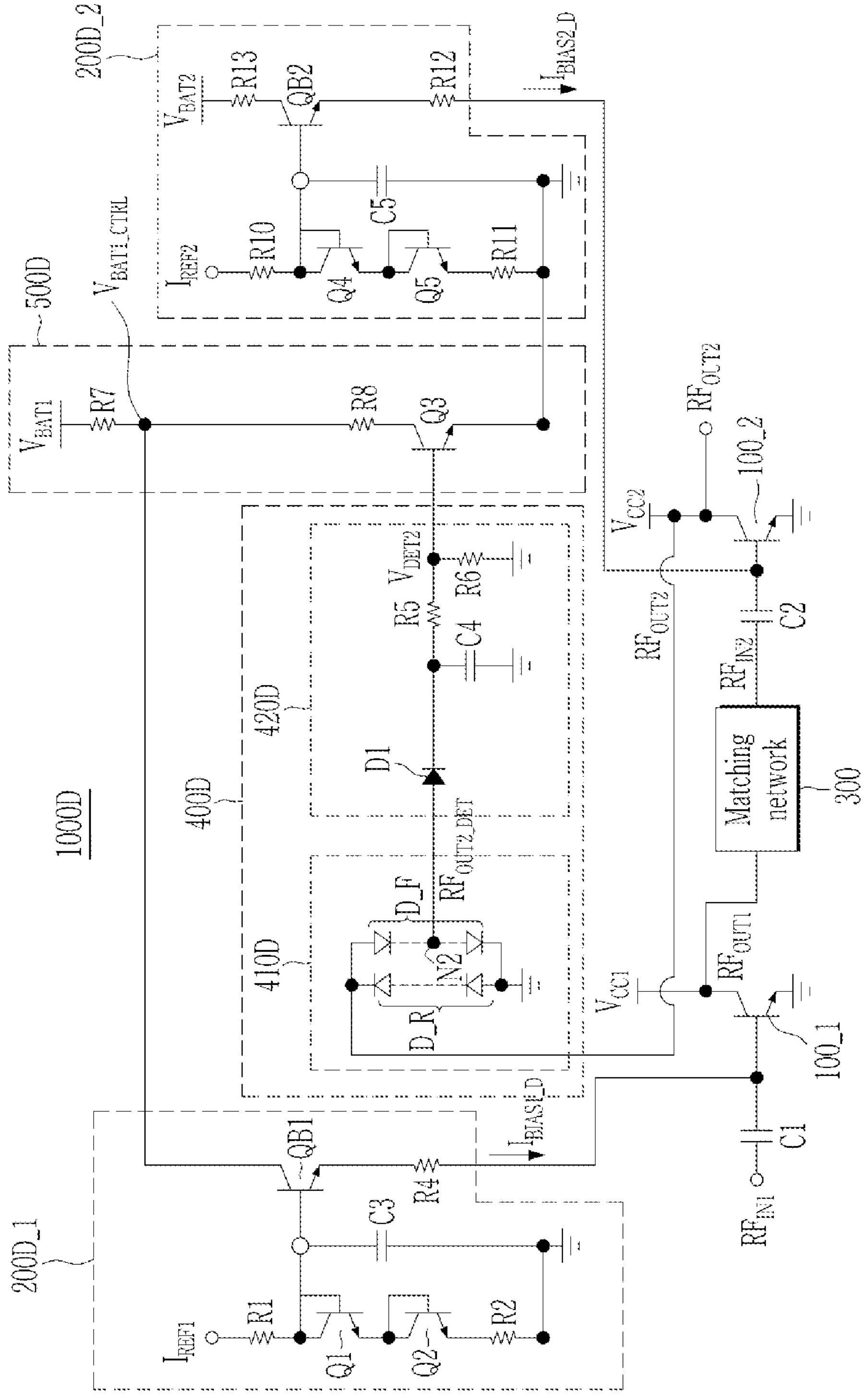
FIG. 12 is a circuit diagram showing internal configurations of a bias circuit 200D_1, a signal detection circuit 400D, a power supply voltage control circuit 500D, and a bias circuit 200D_2 of FIG. 11.

FIG. 12 is a circuit diagram showing internal configurations of the bias circuit 200D_1, the signal detection circuit 400D, the power supply voltage control circuit 500D, and the bias circuit 200D_2 of FIG. 11.

As shown in FIG. 12, the bias circuit 200D_1 may include a transistor Q1, a transistor Q2, a transistor QB1, a resistor R1, a resistor R2, a resistor R4, and a capacitor C3. Since the bias circuit 200D_1 of FIG. 12 is similar to the bias circuit 200B_1 of FIG. 8, overlapping descriptions may be omitted.

A collector of the transistor QB1 may receive the control power supply voltage $V_{BAT1\_CTRL}$. That is, the collector of the transistor QB1 may be connected to the node where the resistor R7 and the resistor R8 are connected to each other. A base of the transistor QB1 may be connected to a base of the transistor Q1. An emitter of the transistor QB1 may be connected to the input terminal (for example, the base) of the power transistor 100_1 through the resistor R4. The current flowing through the emitter of the transistor QB1 is the bias current $I_{BIAS1\_D}$ described with respect to FIG. 11 above. The collector of the transistor QB1 is a terminal that receives the control power supply voltage $V_{BAT1\_CTRL}$, which is a power supply voltage, and the emitter of the transistor QB1 is a terminal that supplies the bias current $I_{BIAS1\_D}$ to the power transistor 100_1.

The signal detection circuit 400D may include an electrostatic discharge (ESD) protection circuit 410D and an envelope detection circuit 420D. Since the specific configuration and operation of the signal detection circuit 400D are the same as those of the signal detection circuit 400B of FIG. 8 and the signal detection circuit 400C of FIG. 10, detailed descriptions may be omitted. The electrostatic discharge protection circuit 410D may include a plurality of forward-biased diodes D_F and a plurality of reverse-biased diodes D_R, and a detection RF signal $RF_{OUT2\_DET}$ may be output from the node N2. In addition, the envelope detection circuit 420D may include a diode D1, a capacitor C4, a resistor R5, and a resistor R6. At the node where the resistor R5 and the resistor R6 are connected to each other, the detection voltage $V_{DET2}$ may be generated (output).

As shown in FIG. 12, the power supply voltage control circuit 500D may include a transistor Q3, a resistor R7, and a resistor R8.

A base of the transistor Q3 may be connected to the other end of the resistor R5 and may receive the detection voltage $V_{DET2}$. That is, the base of the transistor Q3 may be connected to the node where the resistor R5 and the resistor R6 are connected to each other. An emitter of the transistor Q3 may be connected to the ground. A collector of the transistor Q3 may be connected to the power supply voltage $V_{BAT1}$ through the resistor R8 and the resistor R7.

One end of the resistor R7 may be connected to the power supply voltage $V_{BAT1}$, and the resistor R8 may be connected between the other end of the resistor R7 and the collector of the transistor Q3. The voltage at the node where the resistor R7 and the resistor R8 are connected to each other is the control power supply voltage $V_{BAT1\_CTRL}$ described above. The control power supply voltage $V_{BAT1\_CTRL}$ may change depending on whether the transistor Q3 is turned on. Since the detection voltage $V_{DET2}$ is input to the base of the transistor Q3, the transistor Q3 may be turned on or off depending on the level of the detection voltage $V_{DET2}$.

When the detection voltage $V_{DET2}$ is above a predetermined level, the transistor Q3 turns on. When the detection voltage $V_{DET2}$ is above the predetermined level, the output RF signal $RF_{OUT2}$ is excessive (abnormal). That is, this is a case in which the protection operation is performed. When performing a protection operation, the magnitude of the output RF signal $RF_{OUT2}$ may be set in advance, and the level of the corresponding detection voltage $V_{DET2}$ may be adjusted according to the values of the resistor R5 and the resistor R6.

When the transistor Q3 is turned on, the control power supply voltage $V_{BAT1\_CTRL}$ may have the seventh voltage level. That is, the control power supply voltage $V_{BAT1\_CTRL}$ becomes the abnormal control power supply voltage $V_{BAT1\_CTRL\_ABNORMAL}$. Similar to Equation 1 and Equation 3 above, the abnormal control power supply voltage $V_{BAT1\_CTRL\_ABNORMAL}$ may have a value expressed by Equation 5 below.

$$V_{BAT1\_CTRL\_ABNORMAL} = \frac{R8}{R7+R8} \cdot V_{BAT1} \quad (5)$$

When the detection voltage $V_{DET2}$ is below the predetermined level, the transistor Q3 turns off. When the detection voltage $V_{DET2}$ is less than the predetermined level, the output RF signal $RF_{OUT2}$ is not excessive (normal). That is, this is a case in which the protection operation is not performed.

When the transistor Q3 is turned off, the control power supply voltage $V_{BAT1\_CTRL}$ may have the eighth voltage level. That is, the control power supply voltage $V_{BAT1\_CTRL}$ becomes the normal control power voltage $V_{BAT1\_CTRL\_NORMAL}$. Similar to Equation 2 and Equation 4 above, the normal control power supply voltage $V_{BAT1\_CTRL\_NORMAL}$ may have a value expressed by Equation 6 below.

$$V_{BAT1\_CTRL\_NORMAL} = V_{BAT1} - I_{R7} \cdot R7 \quad (6)$$

Referring to Equations 5 and 6 above, the abnormal control power supply voltage $V_{BAT1\_CTRL\_ABNORMAL}$ has a lower value than the normal control power supply voltage $V_{BAT1\_CTRL\_NORMAL}$. When the protection operation is performed, the transistor Q3 is turned on, which causes the control power supply voltage $V_{BAT1\_CTRL}$ to decrease (become lower). That is, the seventh voltage level is a voltage level lower than the eighth voltage level.

As shown in FIG. 12, the bias circuit 200D_2 may include a transistor Q4, a transistor Q5, a transistor QB2, a resistor R10, a resistor R11, a resistor R12, a resistor R13, and a capacitor C5. Since the bias circuit 200D_2 of FIG. 12 is similar to the bias circuit 200A_2 of FIG. 3 except for the connection relationship of the transistor QB2, overlapping descriptions may be omitted.

A collector of the transistor QB2 may be connected to the power supply voltage $V_{BAT2}$ through the resistor R13, and a base of the transistor QB2 may be connected to the base of the transistor Q4. An emitter of the transistor QB2 may be connected to the input terminal (for example, the base) of the power transistor 100_2 through the resistor R12. The current flowing through the emitter of the transistor QB2 is the bias current $I_{BIAS2\_D}$ described with respect to FIG. 11. The collector of the transistor QB2 is a terminal that receives the power supply voltage $V_{BAT2}$, and the emitter of the transistor QB2 is a terminal that supplies the bias current $I_{BIAS2\_D}$ to the power transistor 100_2.

In FIG. 12, the bias current $I_{BIAS1\_D}$ may change based on the control power supply voltage $V_{BAT1\_CTRL}$. When the control power supply voltage $V_{BAT1\_CTRL}$ decreases (becomes lower), the bias current $I_{BIAS1\_D}$ also decreases. As an example, when the control power supply voltage $V_{BAT1\_CTRL}$ is lower than a predetermined threshold voltage, the transistor QB1 does not operate (that is, the transistor QB1 is turned off), which may cause the bias current $I_{BIAS1\_D}$ to be 0 mA.

When the control power supply voltage $V_{BAT1\_CTRL}$ is the normal control power supply voltage $V_{BAT1\_CTRL\_NORMAL}$, the transistor QB1 receives a normal power voltage. Due to this, the bias current $I_{BIAS2\_D}$ also has a normal value. In other words, the bias circuit 200D_1 generates the normal bias current $I_{BIAS1\_D\_NORMAL}$. Due to the normal bias current $I_{BIAS1\_D\_NORMAL}$, the power transistor 100_1 may perform a normal amplification operation.

When the transistor Q3 is turned on due to an excessive output RF signal $RF_{OUT2}$, the control power supply voltage $V_{BAT1\_CTRL}$ becomes the abnormal control power supply voltage $V_{BAT1\_CTRL\_ABNORMAL}$. The transistor QB1 receives the abnormal control power supply voltage $V_{BAT1\_CTRL\_ABNORMAL}$, which reduces the bias current $I_{BIAS1\_D}$. In other words, the bias circuit 200D_1 generates the abnormal bias current $I_{BIAS1\_D\_ABNORMAL}$. Due to the abnormal bias current $I_{BIAS1\_D\_ABNORMAL}$, the peak voltage applied to the power transistor 100_1 does not exceed a breakdown voltage. Through this, the power amplifier 1000D may be protected from excessive RF signals.

The power amplifier 1000D according to another example performs the protection operation only when the output RF signal $RF_{OUT2}$ is excessive (that is, abnormal) and does not perform the protection operation otherwise. That is, the transistor Q3 of FIG. 12 is turned on only when the output RF signal $RF_{OUT2}$ is excessive (that is, abnormal); otherwise it remains turned off. Since the transistor Q3 does not continuously turn on and off, spurs due to oscillation may not occur.

In FIG. 12, the electrostatic discharge protection circuit 410D may be replaced with a capacitor. That is, as described with respect to FIG. 6, the electrostatic discharge protection circuit 410D may be replaced with a capacitor that couples and outputs a portion of the output RF signal $RF_{OUT2}$ to the anode of the diode D1 as a detection RF signal.

Figure 13:
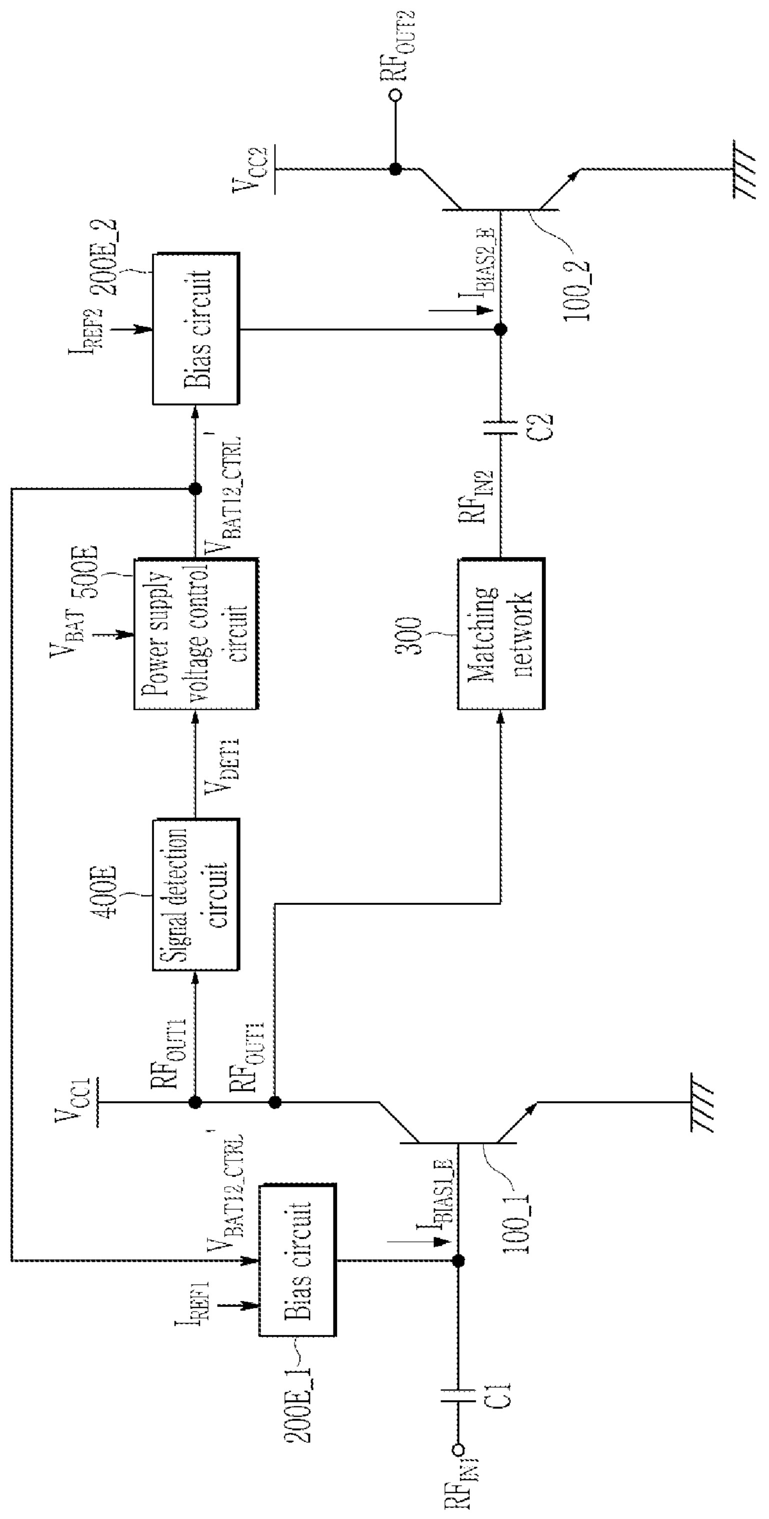
FIG. 13 illustrates a power amplifier 1000E according to another example.

FIG. 13 illustrates a power amplifier 1000E according to another example.

As shown in FIG. 13, the power amplifier 1000E according to another example may include a power transistor 100_1, a bias circuit 200E_1, a capacitor C1, a power transistor 100_2, a bias circuit 200E_2, a capacitor C2, and a matching network 300. Since the power amplifier 1000E of FIG. 13 is similar to the power amplifier 1000A of FIG. 1, the power amplifier 1000B of FIG. 7, the power amplifier 1000C of FIG. 9, and the power amplifier 1000D of FIG. 11, overlapping descriptions may be omitted.

The bias circuit 200E_1 may receive a control power supply voltage $V_{BAT12\_CTRL}'$ from a power supply voltage control circuit 500E and may receive a reference current $I_{REF1}$ from an external source. The bias circuit 200E_1 may generate a bias current $I_{BIAS1\_E}$ required by the power transistor 100_1 using the control power supply voltage $V_{BAT12\_CTRL}'$ and the reference current $I_{REF1}$. The bias current $I_{BIAS1\_D}$ is supplied to the input terminal (for example, the base) of the power transistor 100_1, and the bias level (a bias point) of the power transistor 100_1 may be set by the bias current $I_{BIAS1\_D}$.

The bias circuit 200E_2 may receive the control power supply voltage $V_{BAT12\_CTRL}'$ from the power supply voltage control circuit 500E and may receive a reference current $I_{REF2}$ from an external source. The bias circuit 200E_2 may generate a bias current $I_{BIAS2\_E}$ required by the power transistor 100_2 using the control power supply voltage $V_{BAT12\_CTRL}'$ and the reference current $I_{REF2}$. The bias current $I_{BIAS2\_E}$ is supplied to the input terminal (for example, the base) of the power transistor 100_2, and the bias level (a bias point) of the power transistor 100_2 may be set by the bias current $I_{BIAS2\_E}$.

When an excessive peak voltage is applied to an element (for example, the power transistor 100_1) included in the power amplifier 1000E (that is, in an abnormal state), the power amplifier 1000E according to another example performs a protection operation. To perform this protection operation, the power amplifier 1000E according to another example may further include a signal detection circuit 400E and the power supply voltage control circuit 500E.

The signal detection circuit 400E may receive the output RF signal $RF_{OUT1}$ and detect the magnitude of the output RF signal $RF_{OUT1}$. The magnitude of the output RF signal $RF_{OUT1}$ may correspond to the peak voltage of the output RF signal $RF_{OUT1}$ or may correspond to the power of the output RF signal $RF_{OUT1}$. The signal detection circuit 400E may generate a detection voltage $V_{DET1}$ corresponding to the magnitude of the output RF signal $RF_{OUT1}$. In more detail, the signal detection circuit 400E may detect the envelope of the output RF signal $RF_{OUT1}$ and generate and output the detection voltage $V_{DET1}$ corresponding to the detected envelope. The specific configuration and operation of the signal detection circuit 400E will be described in detail with respect to FIG. 14.

The power supply voltage control circuit 500E may receive a power supply voltage $V_{BAT}$ from an external source and receive the detection voltage $V_{DET1}$ from the signal detection circuit 400E. The power supply voltage control circuit 500E uses the power supply voltage $V_{BAT}$ and the detection voltage $V_{DET1}$ to generate a control power supply voltage $V_{BAT12\_CTRL}'$, and the generated control power supply voltage $V_{BAT12\_CTRL}'$ may be output to the bias circuit 200E_1 and the bias circuit 200E_2. That is, the power supply voltage control circuit 500E can adjust (change) the control power supply voltage $V_{BAT12\_CTRL}'$, which is a power supply voltage to be supplied to the bias circuit 200E_1 and the bias circuit 200E_2 in response to the detection voltage $V_{DET1}$.

The control power supply voltage $V_{BAT12\_CTRL}'$ of FIG. 13 may have two voltage levels. When the detection voltage $V_{DET1}$ has a value higher than a predetermined voltage level, the power supply voltage control circuit 500E may generate the control power supply voltage $V_{BAT12\_CTRL}'$ having a ninth voltage level. When the detection voltage $V_{DET1}$ has a value less than the predetermined voltage level, the power supply voltage control circuit 500E may generate the control power supply voltage $V_{BAT12\_CTRL}'$ having a tenth voltage level. The ninth voltage level may be a voltage level lower than the tenth voltage level. When the output RF signal $RF_{OUT1}$ is excessive, the detection voltage $V_{DET1}$ has a value above the predetermined voltage level, so hereinafter, the control power supply voltage $V_{BAT12\_CTRL}'$ having the ninth voltage level is referred to as “abnormal control power supply voltage $V_{BAT12\_CTRL\_ABNORMAL}'$”. When the output RF signal $RF_{OUT1}$ is not excessive, the detection voltage $V_{DET1}$ has a value below the predetermined voltage level, so hereinafter, the control power supply voltage $V_{BAT12\_CTRL}'$ having the tenth voltage level is referred to as “normal control power supply voltage $V_{BAT12\_CTRL\_NORMAL}'$”.

When the control power supply voltage $V_{BAT12\_CTRL}'$ is the abnormal control power supply voltage $V_{BAT12\_CTRL\_ABNORMAL}'$, the bias circuit 200E_1 may generate an abnormal bias current $I_{BIAS1\_E\_ABNORMAL}$. When the control power supply voltage $V_{BAT12\_CTRL}'$ is the normal control supply power voltage $V_{BAT12\_CTRL\_NORMAL}'$, the bias circuit 200E_1 may generate a normal bias current $I_{BIAS1\_E\_NORMAL}$. The abnormal bias current $I_{BIAS1\_E\_ABNORMAL}$ has a lower current value than the normal bias current $I_{BIAS1\_E\_NORMAL}$. Due to the abnormal bias current $I_{BIAS1\_E\_ABNORMAL}$ having a low current value, the power transistor 100_1 performs an amplification operation with a low gain, and the power amplifier 1000E may be protected from an excessive peak voltage. As an example, the abnormal bias current $I_{BIAS1\_E\_ABNORMAL}$ may be 0 mA. When the abnormal bias current $I_{BIAS1\_E\_ABNORMAL}$ is 0 mA, the power transistor 100_1 does not perform an amplification operation, so the power amplifier 1000E may be protected from an excessive peak voltage.

When the control power supply voltage $V_{BAT12\_CTRL}'$ is the abnormal control power supply voltage $V_{BAT12\_CTRL\_ABNORMAL}'$, the bias circuit 200E_2 may generate an abnormal bias current $I_{BIAS2\_E\_ABNORMAL}$. When the control power supply voltage $V_{BAT12\_CTRL}'$ is the normal control supply power voltage $V_{BAT12\_CTRL\_NORMAL}'$, the bias circuit 200E_2 may generate a normal bias current $I_{BIAS2\_E\_NORMAL}$. The abnormal bias current $I_{BIAS2\_E\_ABNORMAL}$ has a lower current value than the normal bias current $I_{BIAS2\_E\_NORMAL}$. Due to the abnormal bias current $I_{BIAS2\_E\_ABNORMAL}$ having a low current value, the power transistor 100_2 performs an amplification operation with a low gain, and power amplifier 1000E may be protected from an excessive peak voltage. That is, not only the power transistor 100_1 but also the power transistor 100_2 performs an amplification operation with a low gain, and the power amplifier 1000E may be further protected from an excessive peak voltage. As an example, the abnormal bias current $I_{BIAS2\_E\_ABNORMAL}$ may be 0 mA. When the abnormal bias current $I_{BIAS2\_E\_ABNORMAL}$ is 0 mA, the power transistor 100_2 does not perform an amplification operation, so the power amplifier 1000E may be protected from an excessive peak voltage.

Figure 14:
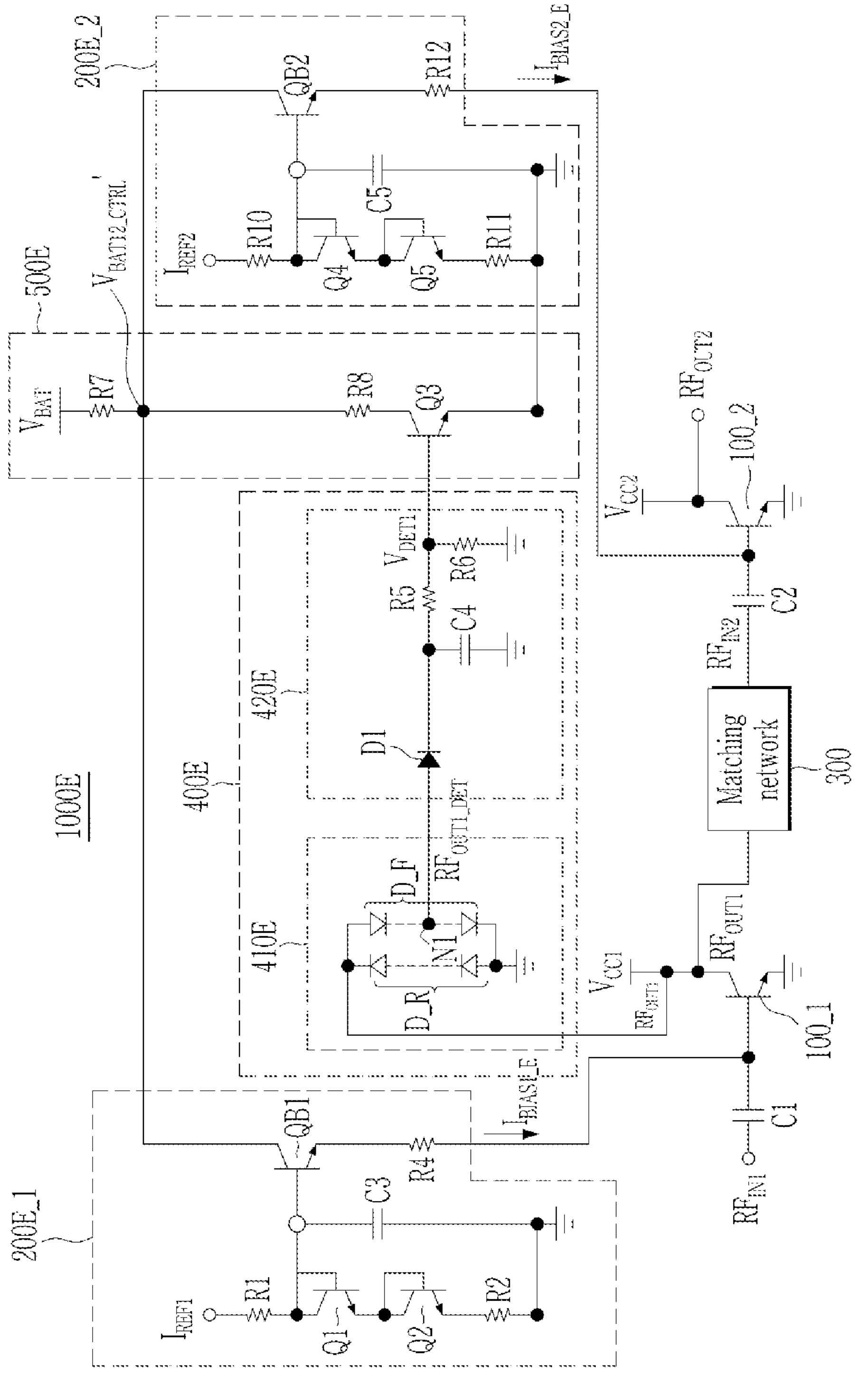
FIG. 14 is a circuit diagram showing internal configurations of a bias circuit 200E_1, a signal detection circuit 400E, a power supply voltage control circuit 500E, and a bias circuit 200E_2 of FIG. 13.

FIG. 14 is a circuit diagram showing internal configurations of the bias circuit 200E_1, the signal detection circuit 400E, the power supply voltage control circuit 500E, and the bias circuit 200E_2 of FIG. 13.

As shown in FIG. 14, the bias circuit 200E_1 may include a transistor Q1, a transistor Q2, a transistor QB1, a resistor R1, a resistor R2, a resistor R4, and a capacitor C3. Since the bias circuit 200E_1 of FIG. 14 is similar to the bias circuit 200B_1 of FIG. 8, overlapping descriptions may be omitted.

A collector of the transistor QB1 may receive the control power supply voltage $V_{BAT12\_CTRL}'$. That is, the collector of the transistor QB1 may be connected to the node where the resistor R7 and the resistor R8 are connected to each other. A base of the transistor QB1 may be connected to a base of the transistor Q1. An emitter of the transistor QB1 may be connected to the input terminal (for example, the base) of the power transistor 100_1 through the resistor R4. The current flowing through the emitter of the transistor QB1 is the bias current $I_{BIAS1\_E}$ described with respect to FIG. 13 above. The collector of the transistor QB1 is a terminal that receives the control power supply voltage $V_{BAT12\_CTRL}'$, which is a power supply voltage, and the emitter of the transistor QB1 is a terminal that supplies the bias current $I_{BIAS1\_E}$ to the power transistor 100_1.

The signal detection circuit 400E may include an electrostatic discharge (ESD) protection circuit 410E and an envelope detection circuit 420E. Since the specific configuration and operation of the signal detection circuit 400E are the same as those of the signal detection circuit 400A of FIG. 3, detailed descriptions may be omitted. The electrostatic discharge protection circuit 410E may include a plurality of forward-biased diodes D_F and a plurality of reverse-biased diodes D_R, and a detection RF signal $R_{FOUT1\_DET}$ may be output from the node N1. In addition, the envelope detection circuit 420E may include a diode D1, a capacitor C4, a resistor R5, and a resistor R6. At the node where the resistor R5 and the resistor R6 are connected to each other, the detection voltage $V_{DET1}$ may be generated (output).

As shown in FIG. 14, the power supply voltage control circuit 500E may include a transistor Q3, a resistor R7, and a resistor R8.

A base of the transistor Q3 may be connected to the other end of the resistor R5 and may receive the detection voltage $V_{DET1}$. That is, the base of the transistor Q3 may be connected to the node where the resistor R5 and the resistor R6 are connected to each other. An emitter of the transistor Q3 may be connected to the ground. A collector of the transistor Q3 may be connected to the power supply voltage $V_{BAT}$ through the resistor R8 and the resistor R7.

One end of the resistor R7 may be connected to the power supply voltage $V_{BAT}$, and the resistor R8 may be connected between the other end of the resistor R7 and the collector of the transistor Q3. The voltage at the node where the resistor R7 and the resistor R8 are connected to each other is the control power supply voltage $V_{BAT12\_CTRL}'$ described above. The control power supply voltage $V_{BAT12\_CTRL}'$ may change depending on whether the transistor Q3 is turned on. Since the detection voltage $V_{DET1}$ is input to the base of the transistor Q3, the transistor Q3 may be turned on or off depending on the level of the detection voltage $V_{DET1}$.

When the detection voltage $V_{DET1}$ is above a predetermined level, the transistor Q3 turns on. When the detection voltage $V_{DET1}$ is above the predetermined level, the output RF signal $RF_{OUT1}$ is excessive (abnormal). That is, this is a case in which the protection operation is performed. When performing a protection operation, the magnitude of the output RF signal $RF_{OUT1}$ may be set in advance, and the level of the corresponding detection voltage $V_{DET1}$ may be adjusted according to the values of the resistor R5 and the resistor R6.

When the transistor Q3 is turned on, the control power supply voltage $V_{BAT12\_CTRL}'$ may have the ninth voltage level. That is, the control power supply voltage $V_{BAT12\_CTRL}'$ becomes the abnormal control power supply voltage $V_{BAT12\_CTRL\_ABNORMAL}'$. The abnormal control power supply voltage $V_{BAT12\_CTRL\_ABNORMAL}'$ may have the same value as $V_{BAT12\_CTRL\_ABNORMAL}$ expressed by Equation 3 above.

When the detection voltage $V_{DET1}$ is below the predetermined level, the transistor Q3 turns off. When the detection voltage $V_{DET1}$ is less than the predetermined level, the output RF signal $RF_{OUT1}$ is not excessive (normal). That is, this is a case in which the protection operation is not performed.

When the transistor Q3 is turned off, the control power supply voltage $V_{BAT12\_CTRL}'$ may have the tenth voltage level. That is, the control power supply voltage $V_{BAT12\_CTRL}'$ becomes the normal control power voltage $V_{BAT12\_CTRL\_NORMAL}'$. The normal control power supply voltage $V_{BAT12\_CTRL\_NORMAL}'$ may have the same value as $V_{BAT12\_CTRL\_NORMAL}$ expressed by Equation 4 above.

The abnormal control power supply voltage $V_{BAT12\_CTRL\_ABNORMAL}'$ has a lower value than the normal control power supply voltage $V_{BAT12\_CTRL\_NORMAL}'$. When the protection operation is performed, the transistor Q3 is turned on, which causes the control power supply voltage $V_{BAT12\_CTRL}'$ to decrease (become lower). That is, the ninth voltage level is a voltage level lower than the tenth voltage level.

As shown in FIG. 14, the bias circuit 200E_2 may include a transistor Q4, a transistor Q5, a transistor QB2, a resistor R10, a resistor R11, a resistor R12, and a capacitor C5.

A collector of the transistor QB2 may receive the control power supply voltage $V_{BAT12\_CTRL}'$. That is, the collector of the transistor QB2 may be connected to the node where the resistor R7 and the resistor R8 are connected to each other. A base of the transistor QB2 may be connected to the base of the transistor Q4. An emitter of the transistor QB2 may be connected to the input terminal (for example, the base) of the power transistor 100_2 through the resistor R12. The current flowing through the emitter of the transistor QB2 is the bias current $I_{BIAS2\_E}$ described with respect to FIG. 13. The collector of the transistor QB2 is a terminal that receives the control power supply voltage $V_{BAT12\_CTRL}'$, which is a power supply voltage, and the emitter of the transistor QB2 is a terminal that supplies the bias current $I_{BIAS2\_E}$ to the power transistor 100_2.

In FIG. 14, the bias current $I_{BIAS1\_E}$ and the bias current $I_{BIAS2\_E}$ may change based on the control power supply voltage $V_{BAT12\_CTRL}'$. When the control power supply voltage $V_{BAT12\_CTRL}'$ decreases (becomes lower), the bias current $I_{BIAS1\_E}$ and the bias current $I_{BIAS2\_E}$ also decrease. As an example, when the control power supply voltage $V_{BAT12\_CTRL}'$ is lower than a predetermined threshold voltage, the transistor QB1 and the transistor QB2 do not operate (that is, the transistor QB1 and the transistor QB2 are turned off), which may cause the bias current $I_{BIAS1\_E}$ and the bias current $I_{BIAS2\_E}$ to be 0 mA.

When the control power supply voltage $V_{BAT12\_CTRL}'$ is the normal control power supply voltage $V_{BAT12\_CTRL\_NORMAL}'$, the transistor QB1 and the transistor QB2 receive a normal power voltage. Due to this, the bias current $I_{BIAS1\_E}$ and the bias current $I_{BIAS2\_E}$ also have a normal value. In other words, the bias circuit 200E_1 generates the normal bias current $I_{BIAS1\_E\_NORMAL}$ and the bias circuit 200E_2 generates the normal bias current $I_{BIAS2\_E\_NORMAL}$. Due to the normal bias current $I_{BIAS1\_E\_NORMAL}$ and the normal bias current $I_{BIAS2\_E\_NORMAL}$, the power transistor 100_1 and the power transistor 100_2 may perform a normal amplification operation.

When the transistor Q3 is turned on due to an excessive output RF signal $RF_{OUT1}$, the control power supply voltage $V_{BAT12\_CTRL}'$ becomes the abnormal control power supply voltage $V_{BAT12\_CTRL\_ABNORMAL}'$. The transistor QB1 and the transistor QB2 receive the abnormal control power supply voltage $V_{BAT12\_CTRL\_ABNORMAL}'$, which reduces the bias current $I_{BIAS1\_E}$ and the bias current $I_{BIAS2\_E}$. In other words, the bias circuit 200E_1 generates the abnormal bias current $I_{BIAS1\_E\_ABNORMAL}$, and the bias circuit 200E_2 generates the abnormal bias current $I_{BIAS2\_E\_ABNORMAL}$. Due to the abnormal bias current $I_{BIAS1\_E\_ABNORMAL}$ and the abnormal bias current $I_{BIAS2\_E\_ABNORMAL}$, the peak voltages applied to the power transistor 100_1 and the power transistor 100_2 do not exceed a breakdown voltage. Through this, the power amplifier 1000E may be protected from excessive RF signals.

The power amplifier 1000E according to another example performs the protection operation only when the output RF signal $RF_{OUT1}$ is excessive (that is, abnormal) and does not perform the protection operation otherwise. That is, the transistor Q3 of FIG. 14 is turned on only when the output RF signal $RF_{OUT1}$ is excessive (that is, abnormal); otherwise it remains turned off. Since the transistor Q3 does not continuously turn on and off, spurs due to oscillation may not occur.

In FIG. 14, the electrostatic discharge protection circuit 410E may be replaced with a capacitor. That is, as described with respect to FIG. 6, the electrostatic discharge protection circuit 410E may be replaced with a capacitor that couples and outputs a portion of the output RF signal $RF_{OUT1}$ to the anode of the diode D1 as a detection RF signal.

Figure 15:
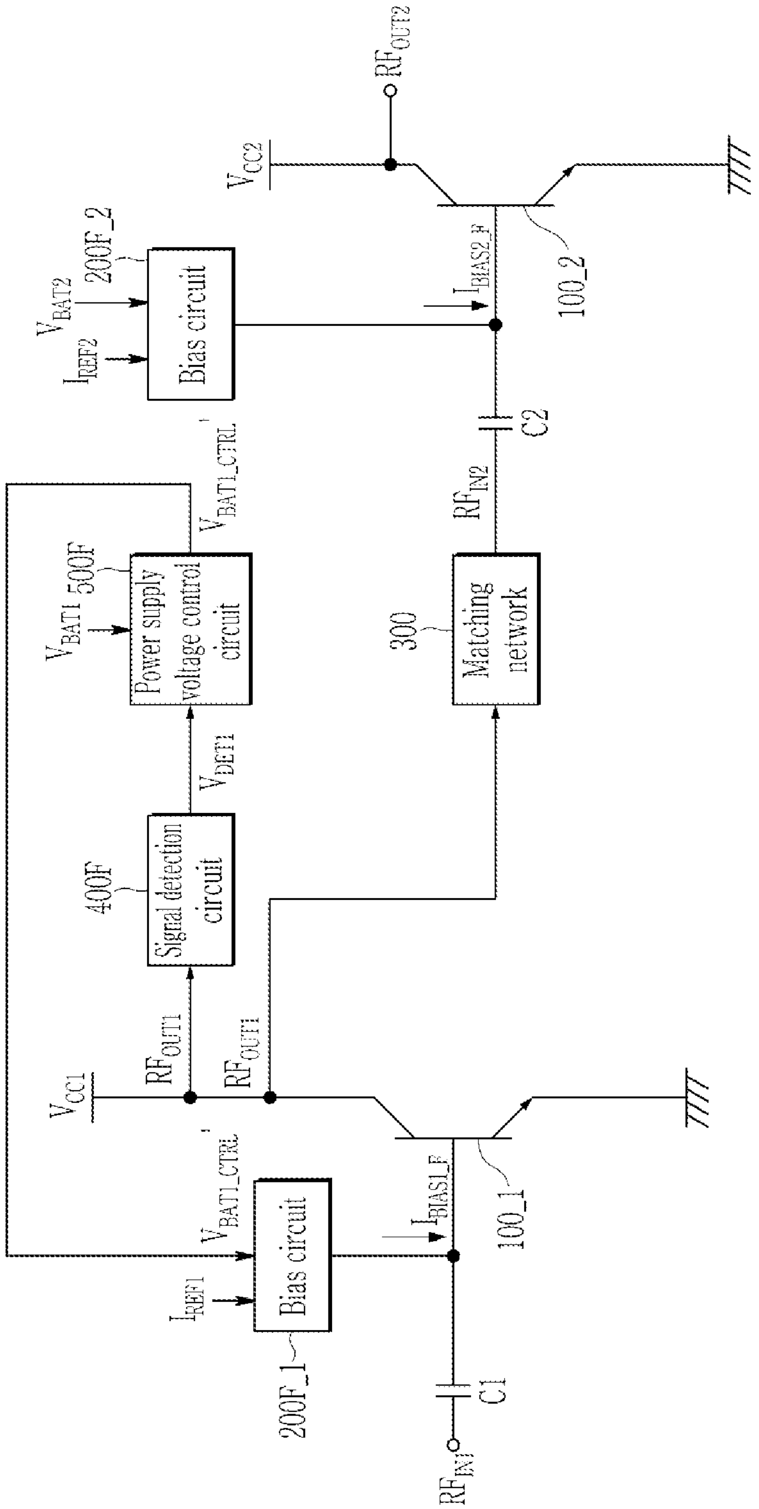
FIG. 15 illustrates a power amplifier 1000F according to another example.

FIG. 15 illustrates a power amplifier 1000F according to another example.

As shown in FIG. 15, the power amplifier 1000F according to another example may include a power transistor 100_1, a bias circuit 200F_1, a capacitor C1, a power transistor 100_2, a bias circuit 200F_2, a capacitor C2, and a matching network 300. Since the power amplifier 1000F of FIG. 15 is similar to the power amplifier 1000A of FIG. 1, the power amplifier 1000B of FIG. 7, the power amplifier 1000C of FIG. 9, the power amplifier 1000D of FIG. 11, and the power amplifier 1000E of FIG. 13, overlapping descriptions may be omitted.

The bias circuit 200F_1 may receive a control power supply voltage $V_{BAT1\_CTRL}'$ from a power supply voltage control circuit 500F and may receive the reference current $I_{REF1}$ from an external source. The bias circuit 200F_1 may generate a bias current $I_{BIAS1\_F}$ required by the power transistor 100_1 using the control power supply voltage $V_{BAT1\_CTRL}'$ and the reference current $I_{REF1}$. The bias current $I_{BIAS1\_F}$ is supplied to the input terminal (for example, the base) of the power transistor 100_1, and the bias level (a bias point) of the power transistor 100_1 may be set by the bias current $I_{BIAS1\_F}$.

The bias circuit 200F_2 may receive a reference current $I_{REF2}$ and a power supply voltage $V_{BAT2}$ from an external source. The bias circuit 200F_2 may generate a bias current $I_{BIAS2\_F}$ required by the power transistor 100_2 using the reference current $I_{REF2}$ and the power supply voltage $V_{BAT2}$. The bias current $I_{BIAS2\_F}$ is supplied to the input terminal (for example, the base) of the power transistor 100_2, and the bias level (a bias point) of the power transistor 100_2 may be set by the bias current $I_{BIAS2\_F}$.

When an excessive peak voltage is applied to an element (for example, the power transistor 100_1) included in the power amplifier 1000F (that is, in an abnormal state), the power amplifier 1000F according to another example performs a protection operation. To perform this protection operation, the power amplifier 1000F according to another example may further include a signal detection circuit 400F and the power supply voltage control circuit 500F.

The signal detection circuit 400F may receive the output RF signal $RF_{OUT1}$ and detect the magnitude of the output RF signal $RF_{OUT1}$. The magnitude of the output RF signal $RF_{OUT1}$ may correspond to the peak voltage of the output RF signal $RF_{OUT1}$ or may correspond to the power of the output RF signal $RF_{OUT1}$. The signal detection circuit 400F may generate a detection voltage $V_{DET1}$ corresponding to the magnitude of the output RF signal $RF_{OUT1}$. In more detail, the signal detection circuit 400F may detect the envelope of the output RF signal $RF_{OUT1}$ and generate and output the detection voltage $V_{DET1}$ corresponding to the detected envelope. The specific configuration and operation of the signal detection circuit 400F will be described in detail with respect to FIG. 16.

The power supply voltage control circuit 500F may receive a power supply voltage $V_{BAT1}$ from an external source and receive the detection voltage $V_{DET1}$ from the signal detection circuit 400F. The power supply voltage control circuit 500F uses the power supply voltage $V_{BAT1}$ and the detection voltage $V_{DET1}$ to generate a control power supply voltage $V_{BAT1\_CTRL}'$, and the generated control power supply voltage $V_{BAT1\_CTRL}'$ may be output to the bias circuit 200F_1. That is, the power supply voltage control circuit 500F can adjust (change) the control power supply voltage $V_{BAT1\_CTRL}'$, which is a power supply voltage to be supplied to the bias circuit 200F_1, in response to the detection voltage $V_{DET1}$.

The control power supply voltage $V_{BAT1\_CTRL}'$ of FIG. 15 may have two voltage levels. When the detection voltage $V_{DET1}$ has a value higher than a predetermined voltage level, the power supply voltage control circuit 500F may generate the control power supply voltage $V_{BAT1\_CTRL}'$ having an eleventh voltage level. When the detection voltage $V_{DET1}$ has a value less than the predetermined voltage level, the power supply voltage control circuit 500F may generate the control power supply voltage $V_{BAT1\_CTRL}'$ having a twelfth voltage level. The eleventh voltage level may be a voltage level lower than the twelfth voltage level. When the output RF signal $RF_{OUT1}$ is excessive, the detection voltage $V_{DET1}$ has a value above the predetermined voltage level, so hereinafter, the control power supply voltage $V_{BAT1\_CTRL}'$ having the eleventh voltage level is referred to as "abnormal control power supply voltage $V_{BAT1\_CTRL\_ABNORMAL}'$". When the output RF signal $RF_{OUT1}$ is not excessive, the detection voltage $V_{DET1}$ has a value below the predetermined voltage level, so hereinafter, the control power supply voltage $V_{BAT1\_CTRL}'$ having the twelfth voltage level is referred to as "normal control power supply voltage $V_{BAT1\_CTRL\_NORMAL}'$".

When the control power supply voltage $V_{BAT1\_CTRL}'$ is the abnormal control power supply voltage $V_{BAT1\_CTRL\_ABNORMAL}'$, the bias circuit 200F_1 may generate an abnormal bias current $I_{BIAS1\_F\_ABNORMAL}$. When the control power supply voltage $V_{BAT1\_CTRL}'$ is the normal control supply power voltage $V_{BAT1\_CTRL\_NORMAL}'$, the bias circuit 200F_1 may generate a normal bias current $I_{BIAS1\_F\_NORMAL}$. The abnormal bias current $I_{BIAS1\_F\_ABNORMAL}$ has a lower current value than the normal bias current $I_{BIAS1\_F\_NORMAL}$. Due to the abnormal bias current $I_{BIAS1\_F\_ABNORMAL}$ having a low current value, the power transistor 100_1 performs an amplification operation with a low gain, and the power amplifier 1000F may be protected from an excessive peak voltage. As an example, the abnormal bias current $I_{BIAS1\_F\_ABNORMAL}$ may be 0 mA. When the abnormal bias current $I_{BIAS1\_F\_ABNORMAL}$ is 0 mA. the power transistor 100_1 does not perform an amplification operation, so the power amplifier 1000F may be protected from an excessive peak voltage.

Figure 16:
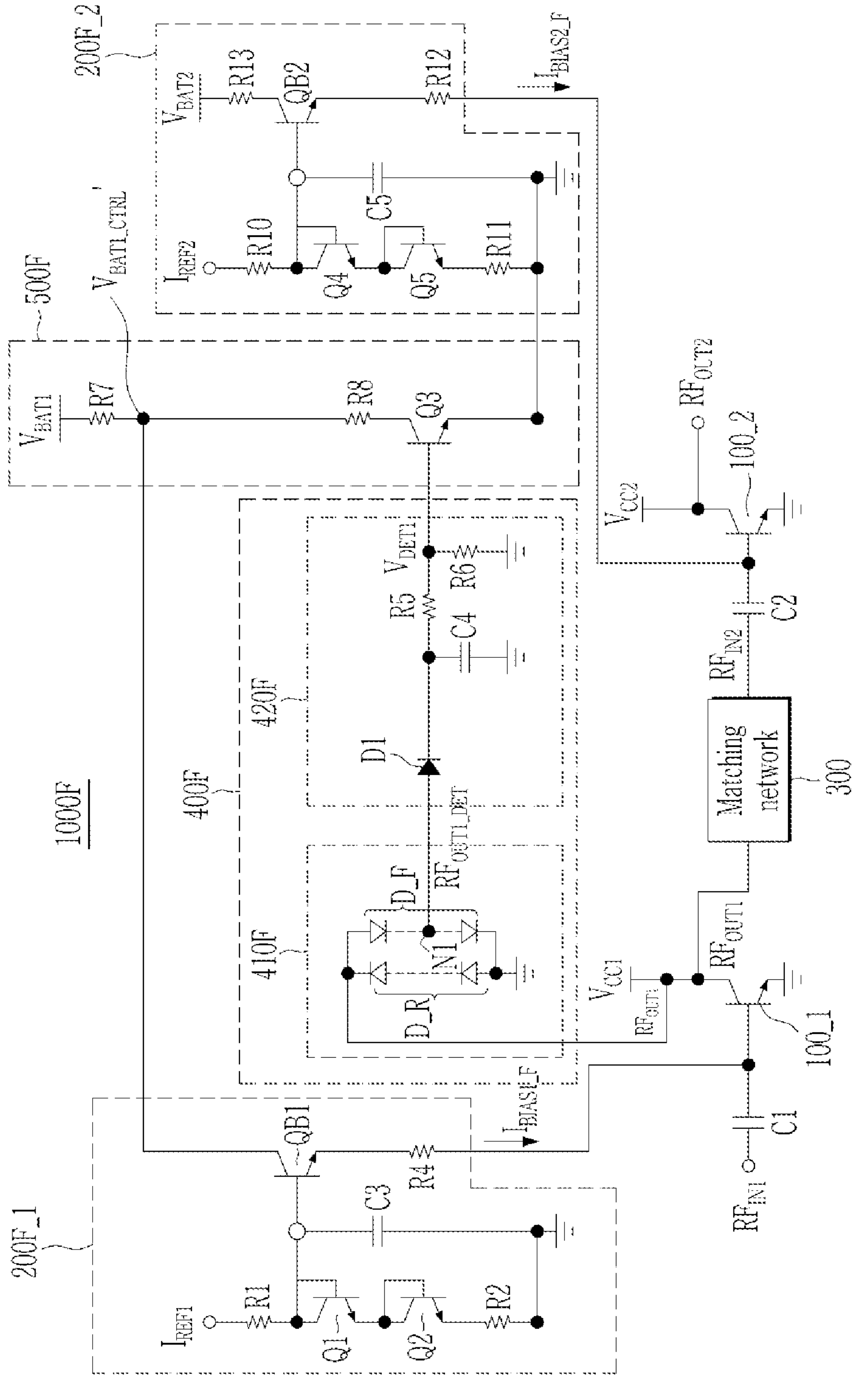
FIG. 16 is a circuit diagram showing internal configurations of a bias circuit 200F_1, a signal detection circuit 400F, a power supply voltage control circuit 500F, and a bias circuit 200F_2 of FIG. 15.

FIG. 16 is a circuit diagram showing internal configurations of the bias circuit 200F_1, the signal detection circuit 400F, the power supply voltage control circuit 500F, and the bias circuit 200F_2 of FIG. 15.

As shown in FIG. 16, the bias circuit 200F_1 may include a transistor Q1, a transistor Q2, a transistor QB1, a resistor R1, a resistor R2, a resistor R4, and a capacitor C3. Since the bias circuit 200F_1 of FIG. 16 is similar to the bias circuit 200B_1 of FIG. 8 and the bias circuit 200D_1 of FIG. 12, overlapping descriptions may be omitted.

A collector of the transistor QB1 may receive the control power supply voltage $V_{BAT1\_CTRL}'$. That is, the collector of the transistor QB1 may be connected to the node where the resistor R7 and the resistor R8 are connected to each other. A base of the transistor QB1 may be connected to a base of the transistor Q1. An emitter of the transistor QB1 may be connected to the input terminal (for example, the base) of the power transistor 100_1 through the resistor R4. The current flowing through the emitter of the transistor QB1 is the bias current $I_{BIAS1\_F}$ described with respect to FIG. 15 above. The collector of the transistor QB1 is a terminal that receives the control power supply voltage $V_{BAT1\_CTRL}'$, which is a power supply voltage, and the emitter of the transistor QB1 is a terminal that supplies the bias current $I_{BIAS1\_F}$ to the power transistor 100_1.

The signal detection circuit 400F may include an electrostatic discharge (ESD) protection circuit 410F and an envelope detection circuit 420F. Since the specific configuration and operation of the signal detection circuit 400F are the same as those of the signal detection circuit 400A of FIG. 3, detailed descriptions may be omitted. The electrostatic discharge protection circuit 410F may include a plurality of forward-biased diodes D_F and a plurality of reverse-biased diodes D_R, and a detection RF signal $RF_{OUT1\_DET}$ may be output from the node N1. In addition, the envelope detection circuit 420F may include a diode D1, a capacitor C4, a resistor R5, and a resistor R6. At the node where the resistor R5 and the resistor R6 are connected to each other, the detection voltage $V_{DET1}$ may be generated (output).

As shown in FIG. 16, the power supply voltage control circuit 500E may include a transistor Q3, a resistor R7, and a resistor R8.

A base of the transistor Q3 may be connected to the other end of the resistor R5 and may receive the detection voltage $V_{DET1}$. That is, the base of the transistor Q3 may be connected to the node where the resistor R5 and the resistor R6 are connected to each other. An emitter of the transistor Q3 may be connected to the ground. A collector of the transistor Q3 may be connected to the power supply voltage $V_{BAT1}$ through the resistor R8 and the resistor R7.

One end of the resistor R7 may be connected to the power supply voltage $V_{BAT1}$, and the resistor R8 may be connected between the other end of the resistor R7 and the collector of the transistor Q3. The voltage at the node where the resistor R7 and the resistor R8 are connected to each other is the control power supply voltage $V_{BAT1\_CTRL}'$ described above. The control power supply voltage $V_{BAT1\_CTRL}'$ may change depending on whether the transistor Q3 is turned on. Since the detection voltage $V_{DET1}$ is input to the base of the transistor Q3, the transistor Q3 may be turned on or off depending on the level of the detection voltage $V_{DET1}$.

When the detection voltage $V_{DET1}$ is above a predetermined level, the transistor Q3 turns on. When the detection voltage $V_{DET1}$ is above the predetermined level, the output RF signal $RF_{OUT1}$ is excessive (abnormal). That is, this is a case in which the protection operation is performed. When performing a protection operation, the magnitude of the output RF signal $RF_{OUT1}$ may be set in advance, and the level of the corresponding detection voltage $V_{DET1}$ may be adjusted according to the values of the resistor R5 and the resistor R6.

When the transistor Q3 is turned on, the control power supply voltage $V_{BAT1\_CTRL}'$ may have the eleventh voltage level. That is, the control power supply voltage $V_{BAT1\_CTRL}'$ becomes the abnormal control power supply voltage $V_{BAT1\_CTRL\_ABNORMAL}'$. The abnormal control power supply voltage $V_{BAT1\_CTRL\_ABNORMAL}'$ may have the same value as $V_{BAT1\_CTRL\_ABNORMAL}$ expressed by Equation 5 above.

When the detection voltage $V_{DET1}$ is below the predetermined level, the transistor Q3 turns off. When the detection voltage $V_{DET1}$ is less than the predetermined level, the output RF signal $RF_{OUT1}$ is not excessive (normal). That is, this is a case in which the protection operation is not performed.

When the transistor Q3 is turned off, the control power supply voltage $V_{BAT1\_CTRL}'$ may have the twelfth voltage level. That is, the control power supply voltage $V_{BAT1\_CTRL}'$ becomes the normal control power voltage $V_{BAT1\_CTRL\_NORMAL}'$. The normal control power supply voltage $V_{BAT1\_CTRL\_NORMAL}'$ may have the same value as $V_{BAT1\_CTRL\_NORMAL}$ expressed by Equation 6 above.

The abnormal control power supply voltage $V_{BAT1\_CTRL\_ABNORMAL}'$ has a lower value than the normal control power supply voltage $V_{BAT1\_CTRL\_NORMAL}'$. When the protection operation is performed, the transistor Q3 is turned on, which causes the control power supply voltage $V_{BAT1\_CTRL}'$ to decrease (become lower). That is, the eleventh voltage level is a voltage level lower than the twelfth voltage level.

As shown in FIG. 16, the bias circuit 200F_2 may include a transistor Q4, a transistor Q5, a transistor QB2, a resistor R10, a resistor R11, a resistor R12, and a capacitor C5. Since the bias circuit 200F_2 of FIG. 16 is similar to the bias circuit 200D_2 of FIG. 12, overlapping descriptions may be omitted.

A collector of the transistor QB2 may be connected to the power supply voltage $V_{BAT2}$ through the resistor R13, and a base of the transistor QB2 may be connected to the base of the transistor Q4. An emitter of the transistor QB2 may be connected to the input terminal (for example, the base) of the power transistor 100_2 through the resistor R12. The current flowing through the emitter of the transistor QB2 is the bias current $I_{BIAS2\_F}$ described with respect to FIG. 15. The collector of the transistor QB2 is a terminal that receives the power supply voltage $V_{BAT2}$, and the emitter of the transistor QB2 is a terminal that supplies the bias current $I_{BIAS2\_F}$ to the power transistor 100_2.

In FIG. 16, the bias current $I_{BIAS1\_F}$ may change based on the control power supply voltage $V_{BAT1\_CTRL}'$. When the control power supply voltage $V_{BAT1\_CTRL}'$ decreases (becomes lower), the bias current $I_{BIAS1\_F}$ also decreases. As an example, when the control power supply voltage $V_{BAT1\_CTRL}'$ is lower than a predetermined threshold voltage, the transistor QB1 does not operate (that is, the transistor QB1 is turned off), which may cause the bias current $I_{BIAS1\_F}$ to be 0 mA.

When the control power supply voltage $V_{BAT1\_CTRL}'$ is the normal control power supply voltage $V_{BAT1\_CTRL\_NORMAL}'$, the transistor QB1 receives a normal power voltage. Due to this, the bias current $I_{BIAS1\_F}$ also has a normal value. In other words, the bias circuit 200F_1 generates the normal bias current $I_{BIAS1\_F\_NORMAL}$ Due to the normal bias current $I_{BIAS1\_F\_NORMAL}$, the power transistor 100_1 may perform a normal amplification operation.

When the transistor Q3 is turned on due to an excessive output RF signal $RF_{OUT1}$, the control power supply voltage $V_{BAT1\_CTRL}'$ becomes the abnormal control power supply voltage $V_{BAT1\_CTRL\_ABNORMAL}'$. The transistor QB1 receives the abnormal control power supply voltage $V_{BAT1\_CTRL\_ABNORMAL}'$, which reduces the bias current $I_{BIAS1\_F}$. In other words, the bias circuit 200F_1 generates the abnormal bias current $I_{BIAS1\_F\_ABNORMAL}$. Due to the abnormal bias current $I_{BIAS1\_F\_ABNORMAL}$, the peak voltage applied to the power transistor 100_1 does not exceed a breakdown voltage. Through this, the power amplifier 1000F may be protected from excessive RF signals.

The power amplifier 1000F according to another example performs the protection operation only when the output RF signal $RF_{OUT1}$ is excessive (that is, abnormal) and does not perform the protection operation otherwise. That is, the transistor Q3 of FIG. 16 is turned on only when the output RF signal $RF_{OUT1}$ is excessive (that is, abnormal); otherwise it remains turned off. Since the transistor Q3 does not continuously turn on and off, spurs due to oscillation may not occur.

In FIG. 16, the electrostatic discharge protection circuit 410F may be replaced with a capacitor. That is, as described with respect to FIG. 6, the electrostatic discharge protection circuit 410F may be replaced with a capacitor that couples and outputs a portion of the output RF signal $RF_{OUT1}$ to the anode of the diode D1 as a detection RF signal.

As described above, according to at least one aspect, by adjusting the bias current in response to the magnitude of the output RF signal, the power amplifier may be protected from excessive RF signals.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier comprising:

a first power transistor configured to amplify a first input radio-frequency (RF) signal and output a first output RF signal;

a first transistor comprising a control terminal, a first terminal configured to receive a first voltage, and a second terminal configured to supply a first bias current to the first power transistor;

a second power transistor configured to amplify a second input RF signal and output a second output RF signal;

a second transistor comprising a control terminal, a first terminal configured to receive a second voltage, and a second terminal configured to supply a second bias current to the second power transistor;

a signal detection circuit configured to detect a first value corresponding to a magnitude of either the first output RF signal or the second output RF signal; and a power supply voltage control circuit configured to adjust a third voltage in response to the first value, the third voltage being either one or both of the first voltage and the second voltage.

2. The power amplifier of claim 1, wherein the power supply voltage control circuit is further configured to decrease the third voltage in response to the first value being greater than a predetermined value, and either one or both of the first transistor and the second transistor are configured to decrease either one or both of the first bias current and the second bias current in response to the third voltage decreasing.

3. The power amplifier of claim 1, wherein the power supply voltage control circuit comprises:

a first resistor connected to a first power supply voltage;

a second resistor having one end connected to the first resistor at a first node; and a third transistor comprising a control terminal configured to receive the first value, a first terminal connected to another end of the second resistor, and a second terminal connected to a ground, and the third voltage is a voltage at the first node where the first resistor and the second resistor are connected to each other.

4. The power amplifier of claim 3, wherein the third transistor is configured to turn on and decrease the third voltage in response to the first value being greater than a predetermined value.

5. The power amplifier of claim 3, wherein the signal detection circuit is further configured to detect an envelope of the first output RF signal or the second output RF signal and output the detected envelope as the first value.

6. The power amplifier of claim 5, wherein the signal detection circuit comprises:

an electrostatic discharge protection circuit comprising a plurality of diodes connected in series between an RF signal output terminal and the ground, the RF signal output terminal being a terminal of the first power transistor configured to output the first output RF signal or a terminal of the second power transistor configured to output the second output RF signal; and an envelope detection circuit configured to receive a first signal from a second node where two diodes of the plurality of diodes are connected to each other, detect an envelope of the first signal, and output the detected envelope of the first signal as the first value.

7. The power amplifier of claim 6, wherein the envelope detection circuit comprises:

a first diode having an anode connected to the second node;

a capacitor connected between a cathode of the first diode and the ground;

a third resistor having one end connected to the cathode of the first diode; and a fourth resistor connected between another end of the third resistor and the ground, and the control terminal of the third transistor is connected to the other end of the third resistor.

8. The power amplifier of claim 1, wherein the signal detection circuit is further configured to detect a value corresponding to the magnitude of the first output RF signal as the first value, and the power supply voltage control circuit is further configured to adjust the second voltage in response to the first value.

9. The power amplifier of claim 8, wherein the power supply voltage control circuit is further configured to decrease the second voltage in response to the first value being greater than a predetermined value, and the second transistor is configured to decrease the second bias current in response to the second voltage decreasing.

10. The power amplifier of claim 8, wherein the power supply voltage control circuit comprises:

a first resistor connected to a first power supply voltage;

a second resistor having one end connected to the first resistor at a node; and a third transistor comprising a control terminal configured to receive the first value, a first terminal connected to another end of the second resistor, and a second terminal connected to a ground, and the first terminal of the second transistor is connected to the node where the first resistor and the second resistor are connected to each other.

11. The power amplifier of claim 1, wherein the signal detection circuit is further configured to detect a value corresponding to the magnitude of the second output RF signal as the first value, and the power supply voltage control circuit is further configured to adjust the first voltage and the second voltage in response to the first value.

12. The power amplifier of claim 11, wherein the power supply voltage control circuit is further configured to decrease the first voltage and the second voltage in response to the first value being greater than a predetermined value, the first transistor is configured to decrease the first bias current in response to the first voltage decreasing, and the second transistor is configured to decrease the second bias current in response to the second voltage decreasing.

13. The power amplifier of claim 11, wherein the power supply voltage control circuit comprises:

a first resistor connected to a first power supply voltage;

a second resistor having one end connected to the first resistor at a node; and a third transistor comprising a control terminal configured to receive the first value, a first terminal connected to another end of the second resistor, and a second terminal connected to a ground, and the first terminal of the first transistor and the first terminal of the second transistor are connected to the node where the first resistor and the second resistor are connected to each other.

14. The power amplifier of claim 1, wherein the signal detection circuit is further configured to detect a value corresponding to the magnitude of the second output RF signal as the first value, and the power supply voltage control circuit is further configured to adjust the second voltage in response to the first value.

15. The power amplifier of claim 14, wherein the signal detection circuit is further configured to decrease the second voltage in response to the first value being greater than a predetermined value, and the second transistor is configured to decrease the second bias current in response to the second voltage decreasing.

16. The power amplifier of claim 15, wherein the power supply voltage control circuit comprises:

a first resistor connected to a first power supply voltage;

a second resistor having one end connected to the first resistor at a node; and a third transistor comprising a control terminal configured to receive the first value, a first terminal connected to another end of the second resistor, and a second terminal connected to a ground, and the first terminal of the second transistor is connected to the node where the first resistor and the second resistor are connected to each other.

17. The power amplifier of claim 1, wherein the signal detection circuit is further configured to detect a value corresponding to the magnitude of the second output RF signal as the first value, and the power supply voltage control circuit is further configured to adjust the first voltage in response to the first value.

18. The power amplifier of claim 17, wherein the power supply voltage control circuit is further configured to decrease the first voltage in response to the first value being greater than a predetermined value, and the first transistor is configured to decrease the first bias current in response to the first voltage decreasing.

19. The power amplifier of claim 18, wherein the power supply voltage control circuit comprises:

a first resistor connected to a first power supply voltage;

a second resistor having one end connected to the first resistor at a node; and a third transistor comprising a control terminal configured to receive the first value, a first terminal connected to another end of the second resistor, and a second terminal connected to a ground, and the first terminal of the first transistor is connected to the node where the first resistor and the second resistor are connected to each other.

20. The power amplifier of claim 1, wherein the signal detection circuit is further configured to detect a value corresponding to the magnitude of the first output RF signal as the first value, and the power supply voltage control circuit is further configured to adjust the first voltage and the second voltage in response to the first value.

21. The power amplifier of claim 20, wherein the power supply voltage control circuit is further configured to decrease the first voltage and the second voltage in response to the first value being greater than a predetermined value, the first transistor is configured to decrease the first bias current in response to the first voltage decreasing, and the second transistor is configured to decrease the second bias current in response to the second voltage decreasing.

22. The power amplifier of claim 21, wherein the power supply voltage control circuit comprises:

a first resistor connected to a first power supply voltage;

a second resistor having one end connected to the first resistor at a node; and a third transistor comprising a control terminal configured to receive the first value, a first terminal connected to another end of the second resistor, and a second terminal connected to a ground, and the first terminal of the first transistor and the first terminal of the second transistor are connected to the node where the first resistor and the second resistor are connected to each other.

23. The power amplifier of claim 1, wherein the signal detection circuit is further configured to detect a value corresponding to the magnitude of the first output RF signal as the first value, and the power supply voltage control circuit is further configured to adjust the first voltage in response to the first value.

24. The power amplifier of claim 23, wherein the power supply voltage control circuit is further configured to decrease the first voltage in response to the first value being greater than a predetermined value, and the first transistor is configured to decrease the first bias current in response to the first voltage decreasing.

25. The power amplifier of claim 24, wherein the power supply voltage control circuit comprises:

a first resistor connected to a first power supply voltage;

a second resistor having one end connected to the first resistor at a node; and a third transistor comprising a control terminal configured to receive the first value, a first terminal connected to another end of the second resistor, and a second terminal connected to a ground, and the first terminal of the first transistor is connected to the node where the first resistor and the second resistor are connected to each other.

26. The power amplifier of claim 1, wherein the second input RF signal is the first output RF signal.

27. A power amplifier comprising:

a power transistor configured to amplify an input radio-frequency (RF) signal and output an output RF signal;

a first transistor comprising a control terminal, a first terminal configured to receive a first voltage, and a second terminal configured to supply a bias current to the power transistor;

a signal detection circuit configured to detect a first value corresponding to a magnitude of the output RF signal; and a power supply voltage control circuit configured to adjust the first voltage in response to the first value.

28. The power amplifier of claim 27, wherein the power supply voltage control circuit is further configured to decrease the first voltage in response to the first value being greater than a predetermined value, and the first transistor is configured to decrease the bias current in response to the first voltage decreasing.

29. The power amplifier of claim 27, wherein the power supply voltage control circuit comprises:

a first resistor connected to a first power supply voltage;

a second resistor having one end connected to the first resistor at a first node; and a second transistor comprising a control terminal configured to receive the first value, a first terminal connected to another end of the second resistor, and a second terminal connected to a ground, and the first voltage is a voltage at the first node where the first resistor and the second resistor are connected to each other.

30. The power amplifier of claim 29, wherein the first terminal of the first transistor is connected to the first node.

31. The power amplifier of claim 29, wherein the second transistor is configured to turn on and decrease the first voltage in response to the first value being greater than a predetermined value.

32. The power amplifier of claim 29, wherein the signal detection circuit is further configured to detect an envelope of the output RF signal as the first value.

33. The power amplifier of claim 32, wherein the signal detection circuit comprises:

an electrostatic discharge protection circuit comprising a plurality of diodes connected in series between an RF signal output terminal and the ground, the RF signal output terminal being a terminal of the power transistor configured to output the output RF signal; and an envelope detection circuit configured to receive a first signal from a second node where two diodes of the plurality of diodes are connected to each other, detect an envelope of the first signal, and output the detected envelope of the first signal as the first value.

34. The power amplifier of claim 33, wherein the envelope detection circuit comprises:

a first diode having an anode connected to the second node;

a capacitor connected between a cathode of the first diode and the ground;

a third resistor having one end connected to the cathode of the first diode; and a fourth resistor connected between another end of the third resistor and the ground, and the control terminal of the second transistor is connected to the other end of the third resistor.

* * * * *